(12) United States Patent
Kitagawa et al.

(10) Patent No.: US 10,208,183 B2
(45) Date of Patent: Feb. 19, 2019

(54) CURABLE COMPOSITION, FILM, AND METHOD OF PRODUCING FILM

(71) Applicant: CANON KABUSHIKI KAISHA, Tokyo (JP)

(72) Inventors: Kenji Kitagawa, Tokyo (JP); Toshiki Ito, Kawasaki (JP); Shiori Yonezawa, Tokyo (JP); Youji Kawasaki, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 453 days.

(21) Appl. No.: 14/906,079

(22) PCT Filed: Aug. 27, 2014

(86) PCT No.: PCT/JP2014/073110
§ 371 (c)(1),
(2) Date: Jan. 19, 2016

(87) PCT Pub. No.: WO2015/030258
PCT Pub. Date: Mar. 5, 2015

(65) Prior Publication Data
US 2016/0160003 A1    Jun. 9, 2016

(30) Foreign Application Priority Data

Aug. 30, 2013 (JP) .................. 2013-179570
Nov. 29, 2013 (JP) .................. 2013-247605
Aug. 8, 2014 (JP) .................. 2014-162297

(51) Int. Cl.
*B32B 3/00* (2006.01)
*C08K 5/00* (2006.01)
(Continued)

(52) U.S. Cl.
CPC ............ *C08K 5/0008* (2013.01); *B29C 43/02* (2013.01); *C08F 2/44* (2013.01); *C08F 2/48* (2013.01);
(Continued)

(58) Field of Classification Search
CPC ........ C08K 5/0008; C08K 5/06; B29C 43/02; C08F 2/44; C08F 2/48; C08J 5/18; G03F 7/0002
See application file for complete search history.

(56) References Cited

U.S. PATENT DOCUMENTS 7,157,036 B2    1/2007    Choi et al.
7,307,118 B2    12/2007   Xu et al.
(Continued)

FOREIGN PATENT DOCUMENTS

JP    63-251401 A     10/1988
JP    2006-528088 A   12/2006
(Continued)

OTHER PUBLICATIONS

Notification of Reasons for Refusal in Japanese Application No. 2014-162297 (dated Aug. 15, 2017).
(Continued)

*Primary Examiner* — Elizabeth E Mulvaney
(74) *Attorney, Agent, or Firm* — Venable LLP

(57) ABSTRACT

Provided is a curable composition, including a polymerization initiator; a polymerizable compound; and an internal addition type release agent having a hydrophilic functional group, in which the internal addition type release agent is prevented from being unevenly distributed in a gas-liquid interface of the curable composition.

15 Claims, 1 Drawing Sheet

(51) Int. Cl.
*C08F 2/44* (2006.01)
*C08F 2/48* (2006.01)
*B29C 43/02* (2006.01)
*C08J 5/18* (2006.01)
*C08K 5/06* (2006.01)
*G03F 7/00* (2006.01)
*B29K 105/00* (2006.01)
*B29L 11/00* (2006.01)
*B29L 31/34* (2006.01)

(52) U.S. Cl.
CPC .................. *C08J 5/18* (2013.01); *C08K 5/06* (2013.01); *G03F 7/0002* (2013.01); *B29K 2105/0002* (2013.01); *B29L 2011/00* (2013.01); *B29L 2031/34* (2013.01); *C08J 2347/00* (2013.01)

(56) References Cited

U.S. PATENT DOCUMENTS

| | | |
|---|---|---|
| 7,837,921 B2 | 11/2010 | Xu et al. |
| 8,142,703 B2 | 3/2012 | Xu et al. |
| 8,152,511 B2 | 4/2012 | Xu et al. |
| 8,268,220 B2 | 9/2012 | Xu et al. |
| 8,672,663 B2 | 3/2014 | Tanabe et al. |
| 9,238,703 B2 | 1/2016 | Kishi et al. |
| 2005/0160934 A1 | 7/2005 | Xu et al. |
| 2006/0108710 A1 | 5/2006 | Xu et al. |
| 2006/0279024 A1 | 12/2006 | Choi et al. |
| 2007/0272825 A1 | 11/2007 | Xu et al. |
| 2011/0215503 A1 | 9/2011 | Xu et al. |
| 2012/0199997 A1 | 8/2012 | Tanabe et al. |
| 2013/0052431 A1 | 2/2013 | Enomoto et al. |
| 2013/0140744 A1 | 6/2013 | Nakai et al. |
| 2014/0145370 A1 | 5/2014 | Tanabe et al. |
| 2014/0154471 A1 | 6/2014 | Kodama et al. |
| 2014/0329057 A1 | 11/2014 | Matsufuji et al. |

FOREIGN PATENT DOCUMENTS

| | | |
|---|---|---|
| JP | 2011-006693 A | 1/2011 |
| JP | 2012-164785 A | 8/2012 |
| JP | 2013-035266 A | 2/2013 |
| JP | 2013-036014 A | 2/2013 |
| JP | 2013-036027 A | 2/2013 |
| JP | 2013-62489 A | 4/2013 |
| KR | 10-2013-0023092 A | 3/2013 |
| TW | 201327040 A1 | 7/2013 |
| WO | 2011/155480 A1 | 12/2011 |

OTHER PUBLICATIONS

Extended European Search Report in European Application No. 14840642.4 (dated Mar. 23, 2017).

Shravanthi Reddy et al., "Simulation of Fluid Flow in the Step and Flash Imprint Lithography Process," 82 Microelectron. Eng. 60-70 (Jul. 2005).

Office Action in Taiwanese Application No. 103129885 (dated Aug. 2015).

Notice of Preliminary Rejection in Korean Application No. 10-2016-7007453 (dated Jan. 13, 2017).

Notification of Reasons for Refusal in Japanese Application No. 2014-162297 (dated Dec. 19, 2017).

Notification of First Office Action in Chinese Application No. 201480047587.X (dated Sep. 2, 2016).

CURABLE COMPOSITION, FILM, AND METHOD OF PRODUCING FILM

TECHNICAL FIELD

The present invention relates to a curable composition, a film, and a method of producing a film.

BACKGROUND ART

A nanoimprint method is available as a microprocessing method needed for the production of a semiconductor integrated circuit or the like. The nanoimprint method is a method including curing a curable composition applied to a substrate with light, heat, or the like under a state in which a mold having formed thereon a fine irregular pattern is pressed against the curable composition; and transferring the irregularities of the mold onto the curable composition on the substrate to produce a cured film. The employment of the method enables the production of a cured film having a pattern shape imitating the irregular shape of the mold.

In recent years, vigorous researches have been conducted on a curable composition to be used in the nanoimprint method. Japanese Patent Application Laid-Open No. 2006-528088 (PTL 1) discloses a method of producing a cured film, including applying a curable composition containing a surfactant as an internal addition type release agent onto a substrate so that the surfactant may be unevenly distributed at a high concentration toward the upper layer of the curable composition at the stage of the application onto the substrate.

However, conventional methods including PTL 1 have involved the following problem. Although the releasability of a cured film is excellent, the filling speed of a curable composition required when a mold is pressed against the curable composition to fill the curable composition into its fine irregular pattern is slow.

CITATION LIST

Patent Literature

PTL 1: Japanese Patent Application Laid-Open No. 2006-528088

Non Patent Literature

NPL 1: S. Reddy, R. T. Bonnecaze/Microelectronic Engineering, 82 (2005), 60-70

SUMMARY OF INVENTION

Technical Problem

The present invention has been made to solve the above-mentioned problem, and an object of the present invention is to provide a curable composition that has a fast filling speed into a mold and provides a film excellent in releasability.

According to one embodiment of the present invention, there is provided a curable composition, including: a polymerization initiator; a polymerizable compound; and an internal addition type release agent having a hydrophilic functional group, in which the internal addition type release agent is prevented from being unevenly distributed in a gas-liquid interface of the curable composition.

Further features of the present invention will become apparent from the following description of exemplary embodiments with reference to the attached drawings.

BRIEF DESCRIPTION OF DRAWINGS

FIGS. 1A, 1B1, 1B2, 1C, 1D, 1E and 1F are each a schematic sectional view illustrating an example of a method of producing a film according to an embodiment of the present invention.

DESCRIPTION OF EMBODIMENTS

Figure 1A:
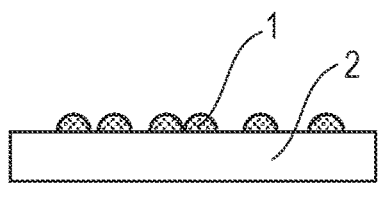
Figure 1A:
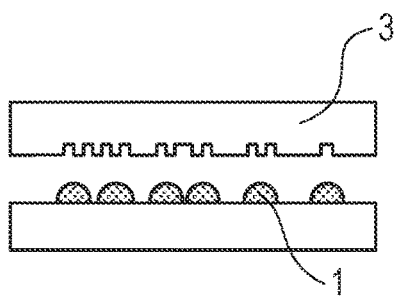
Figure 1A:
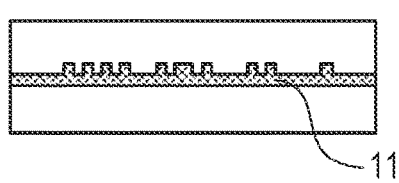

Preferred embodiments of the present invention will now be described in detail in accordance with the accompanying drawings.

A curable composition of the present invention is a composition including a polymerization initiator; a polymerizable compound; and an internal addition type release agent having a hydrophilic functional group. Here, the internal addition type release agent in the curable composition of the present invention is a material that is not unevenly distributed in a gas-liquid interface of the curable composition of the present invention.

Hereinafter, an embodiment of the present invention is described in detail. However, the present invention is not limited to the embodiment to be described below. In other words, the present invention of course comprehends embodiments obtained by, for example, appropriately changing or modifying the embodiment to be described below based on the ordinary knowledge of a person skilled in the art to such an extent as not to deviate from the gist of the present invention.

(1) Curable Composition

A curable composition of the present invention is a mixture containing at least the following (1A) to (1C):

(1A) a polymerization initiator;
(1B) a polymerizable compound; and
(1C) an internal addition type release agent.

It should be noted that the internal addition type release agent is a compound that has a hydrophilic functional group and is not unevenly distributed in a gas-liquid interface. Here, the term "hydrophilic" as used in the present invention means that the release agent has a better affinity for water than that of the polymerizable compound which is a main component of the curable composition. Each component is described below.

(1A) Polymerization Initiator

Examples of the polymerization initiator include a photopolymerization initiator and a thermal polymerization initiator.

The photopolymerization initiator is a substance that generates a reactive species causing the polymerization reaction of the polymerizable compound through light stimulation. Specific examples thereof include a photoradical generator that generates a radical through light stimulation and a photoacid generator that generates a proton ($H^+$) through light stimulation.

The photoradical generator is a polymerization initiator that generates a radical with light (an infrared ray, a visible ray, an ultraviolet ray, a far ultraviolet ray, an X-ray, or a charged particle ray such as an electron beam, a radiation), and is mainly used when the polymerizable compound is a radical polymerizable compound. Meanwhile, the photoacid generator is a polymerization initiator that generates an acid (proton) with light, and is mainly used when the polymerizable compound is a cationically polymerizable compound.

Examples of the photoradical generator include, but not limited to, 2,4,5-triarylimidazole dimers that may have a substituent such as a 2-(o-chlorophenyl)-4,5-diphenylimidazole dimer, a 2-(o-chlorophenyl)-4,5-di(methoxyphenyl) imidazole dimer, a 2-(o-fluorophenyl)-4,5-diphenylimidazole dimer, and a 2-(o- or p-methoxyphenyl)-4,5-diphenylimidazole dimer; benzophenone derivatives such as benzophenone, N,N'-tetramethyl-4,4'-diaminobenzophenone (Michler's ketone), N,N'-tetraethyl-4,4'-diaminobenzophenone, 4-methoxy-4'-dimethylaminobenzophenone, 4-chlorobenzophenone, 4,4'-dimethoxybenzophenone, and 4,4'-diaminobenzophenone; aromatic ketone derivatives such as 2-benzyl-2-dimethylamino-1-(4-morpholinophenyl)-butanone-1,2-methyl-1-[4-(methylthio)phenyl]-2-morpholino-propanon-1-one; quinones such as 2-ethylanthraquinone, phenanthrenequinone, 2-t-butylanthraquinone, octamethylanthraquinone, 1,2-benzanthraquinone, 2,3-benzanthraquinone, 2-phenylanthraquinone, 2,3-diphenylanthraquinone, 1-chloroanthraquinone, 2-methylanthraquinone, 1,4-naphthoquinone, 9,10-phenanthraquinone, 2-methyl-1,4-naphthoquinone, and 2,3-dimethylanthraquinone; benzoin ether derivatives such as benzoin methyl ether, benzoin ethyl ether, and benzoin phenyl ether; benzoin derivatives such as benzoin, methylbenzoin, ethylbenzoin, and propylbenzoin; benzyl derivatives such as benzyl dimethyl ketal; acridine derivatives such as 9-phenylacridine and 1,7-bis(9,9'-acridinyl)heptane; N-phenylglycine derivatives such as N-phenylglycine; acetophenone derivatives such as acetophenone, 3-methylacetophenone, acetophenone benzyl ketal, 1-hydroxycyclohexyl phenyl ketone, and 2,2-dimethoxy-2-phenylacetophenone; thioxanthone derivatives such as thioxanthone, diethylthioxanthone, 2-isopropylthioxanthone, and 2-chlorothioxanthone; and xanthone, fluorenone, benzaldehyde, fluorene, anthraquinone, triphenylamine, carbazole, 1-(4-isopropylphenyl)-2-hydroxy-2-methylpropan-1-one, 2-hydroxy-2-methyl-1-phenylpropan-1-one, 2,4,6-trimethylbenzoyldiphenylphosphine oxide, and bis(2,6-dimethoxybenzoyl)-2,4,4-trimethylpentylphosphine oxide. It should be noted that one kind of those photoradical generators may be used alone, or two or more kinds thereof may be used in combination.

Examples of commercially available products corresponding to the photoradical generator include, but not limited to, Irgacure 184, 369, 651, 500, 819, 907, 784, and 2959, CGI-1700, -1750, and -1850, CG24-61, and Darocur 1116 and 1173 (all of the above are manufactured by Ciba Japan), Lucirin TPO, LR8893, and LR8970 (all of the above are manufactured by BASF), and Ubecryl P36 (manufactured by UCB).

Examples of the photoacid generator include, but not limited to, an onium salt compound, a sulfone compound, a sulfonic acid ester compound, a sulfonimide compound, and a diazomethane compound. In the present invention, an onium salt compound is preferred.

Examples of the onium salt compound include an iodonium salt, a sulfonium salt, a phosphonium salt, a diazonium salt, an ammonium salt, and a pyridinium salt.

Specific examples of the onium salt compound include bis(4-t-butylphenyl)iodonium perfluoro-n-butanesulfonate, bis(4-t-butylphenyl)iodonium trifluoromethanesulfonate, bis(4-t-butylphenyl)iodonium 2-trifluoromethylbenzenesulfonate, bis(4-t-butylphenyl)iodonium pyrenesulfonate, bis(4-t-butylphenyl)iodonium n-dodecylbenzenesulfonate, bis(4-t-butylphenyl)iodonium p-toluenesulfonate, bis(4-t-butylphenyl)iodonium benzenesulfonate, bis(4-t-butylphenyl)iodonium 10-camphorsulfonate, bis(4-t-butylphenyl)iodonium n-octanesulfonate, diphenyliodonium perfluoro-n-butanesulfonate, diphenyliodonium trifluoromethanesulfonate, diphenyliodonium 2-trifluoromethylbenzenesulfonate, diphenyliodonium pyrenesulfonate, diphenyliodonium n-dodecylbenzenesulfonate, diphenyliodonium p-toluenesulfonate, diphenyliodonium benzenesulfonate, diphenyliodonium 10-camphorsulfonate, diphenyliodonium n-octanesulfonate, triphenylsulfonium perfluoro-n-butanesulfonate, triphenylsulfonium trifluoromethanesulfonate, triphenylsulfonium 2-trifluoromethylbenzenesulfonate, triphenylsulfonium pyrenesulfonate, triphenylsulfonium n-dodecylbenzenesulfonate, triphenylsulfonium p-toluenesulfonate, triphenylsulfonium benzenesulfonate, triphenylsulfonium 10-camphorsulfonate, triphenylsulfonium n-octanesulfonate, diphenyl(4-t-butylphenyl)sulfonium perfluoro-n-butanesulfonate, diphenyl(4-t-butylphenyl)sulfonium trifluoromethanesulfonate, diphenyl(4-t-butylphenyl)sulfonium 2-trifluoromethylbenzenesulfonate, diphenyl(4-t-butylphenyl)sulfonium pyrenesulfonate, diphenyl(4-t-butylphenyl)sulfonium n-dodecylbenzenesulfonate, diphenyl(4-t-butylphenyl)sulfonium p-toluenesulfonate, diphenyl(4-t-butylphenyl)sulfonium benzenesulfonate, diphenyl(4-t-butylphenyl)sulfonium 10-camphorsulfonate, diphenyl(4-t-butylphenyl)sulfonium n-octanesulfonate, tris(4-methoxyphenyl)sulfonium perfluoro-n-butanesulfonate, tris(4-methoxyphenyl)sulfonium trifluoromethanesulfonate, tris(4-methoxyphenyl)sulfonium 2-trifluoromethylbenzenesulfonate, tris(4-methoxyphenyl)sulfonium pyrenesulfonate, tris(4-methoxyphenyl)sulfonium n-dodecylbenzenesulfonate, tris(4-methoxyphenyl)sulfonium p-toluenesulfonate, tris(4-methoxyphenyl)sulfonium benzenesulfonate, tris(4-methoxyphenyl)sulfonium 10-camphorsulfonate, and tris(4-methoxyphenyl)sulfonium n-octanesulfonate.

Examples of the sulfone compound include β-ketosulfone, β-sulfonylsulfone, and α-diazo compounds thereof. Specific examples of the sulfone compound include, but not limited to, phenacyl phenyl sulfone, mesityl phenacyl sulfone, bis(phenylsulfonyl)methane, and 4-trisphenacyl sulfone.

Examples of the sulfonic acid ester compound include an alkyl sulfonic acid ester, a haloalkyl sulfonic acid ester, an aryl sulfonic acid ester, and an iminosulfonate. Specific examples of the sulfonic acid ester compound include, but not limited to, α-methylolbenzoin perfluoro-n-butanesulfonate, α-methylolbenzoin trifluoromethanesulfonate, and α-methylolbenzoin 2-trifluoromethylbenzenesulfonate.

Specific examples of the sulfonimide compound include, but not limited to, N-(trifluoromethylsulfonyloxy)succinimide, N-(trifluoromethylsulfonyloxy)phthalimide, N-(trifluoromethylsulfonyloxy)diphenylmaleimide, N-(trifluoromethylsulfonyloxy)bicyclo[2.2.1]hept-5-ene-2,3-dicarboximide, N-(trifluoromethylsulfonyloxy)-7-oxabicyclo[2.2.1]hept-5-ene-2,3-dicarboximide, N-(trifluoromethylsulfonyloxy)bicyclo[2.2.1]heptan-5,6-oxy-2,3-dicarboximide, N-(trifluoromethylsulfonyloxy)naphthylimide, N-(10-camphorsulfonyloxy)succinimide, N-(10-camphorsulfonyloxy)phthalimide, N-(10-camphorsulfonyloxy)diphenylmaleimide, N-(10-camphorsulfonyloxy)bicyclo[2.2.1]hept-5-ene-2,3-dicarboximide, N-(10-camphorsulfonyloxy)-7-oxabicyclo[2.2.1]hept-5-ene-2,3-dicarboximide, N-(10-camphorsulfonyloxy)bicyclo[2.2.1]heptan-5,6-oxy-2,3-dicarboximide, N-(10-camphorsulfonyloxy)naphthylimide, N-(4-methylphenylsulfonyloxy)succinimide, N-(4-methylphenylsulfonyloxy)phthalimide, N-(4-methylphenylsulfonyloxy)diphenylmaleimide, N-(4-methylphenylsulfonyloxy)bicyclo[2.2.1]hept-5-ene-2,3-dicarboximide, N-(4- methylphenylsulfonyloxy)-7-oxabicyclo[2.2.1]hept-5-ene-2,3-dicarboximide, N-(4-methylphenylsulfonyloxy)bicyclo[2.2.1]heptan-5,6-oxy-2,3-dicarboximide, N-(4-methylphenylsulfonyloxy)naphthylimide, N-(2-trifluoromethylphenylsulfonyloxy)succinimide, N-(2-trifluoromethylphenylsulfonyloxy)phthalimide, N-(2-trifluoromethylphenylsulfonyloxy)diphenylmaleimide, N-(2-trifluoromethylphenylsulfonyloxy)bicyclo[2.2.1]hept-5-ene-2,3-dicarboximide, N-(2-trifluoromethylphenylsulfonyloxy)-7-oxabicyclo[2.2.1]hept-5-ene-2,3-dicarboximide, N-(2-trifluoromethylphenylsulfonyloxy)bicyclo[2.2.1]heptan-5,6-oxy-2,3-dicarboximide, N-(2-trifluoromethylphenylsulfonyloxy)naphthylimide, N-(4-fluorophenylsulfonyloxy)succinimide, N-(4-fluorophenyl)phthalimide, N-(4-fluorophenylsulfonyloxy)diphenylmaleimide, N-(4-fluorophenylsulfonyloxy)bicyclo[2.2.1]hept-5-ene-2,3-dicarboximide, N-(4-fluorophenylsulfonyloxy)-7-oxabicyclo[2.2.1]hept-5-ene-2,3-dicarboximide, N-(4-fluorophenylsulfonyloxy)bicyclo[2.2.1]heptan-5,6-oxy-2,3-dicarboximide, and N-(4-fluorophenylsulfonyloxy)naphthylimide.

Specific examples of the diazomethane compound include, but not limited to, bis(trifluoromethylsulfonyl)diazomethane, bis(cyclohexylsulfonyl)diazomethane, bis(phenylsulfonyl)diazomethane, bis(p-toluenesulfonyl)diazomethane, methylsulfonyl p-toluenesulfonyldiazomethane, cyclohexylsulfonyl(1,1-dimethylethylsulfonyl)diazomethane, and bis(1,1-dimethylethylsulfonyl)diazomethane.

The thermal polymerization initiator is a substance that generates a reactive species causing the polymerization reaction of the polymerizable compound through thermal stimulation. The initiator is specifically, for example, a thermal radical generator that generates a radical through thermal stimulation.

Examples of the thermal radical generator include an azo compound and an organic peroxide.

Examples of the azo compound include azobisisobutyronitrile, 2,2'-azobis(2,4-dimethylvaleronitrile), 2,2'-azobis(isobutyronitrile), 2,2'-azobis(2-methylbutyronitrile), 1,1'-azobis(1-cyclohexanecarbonitrile), 2,2'-azobis(methyl isobutyrate), and 2,2'-azobis(2-amidinopropane)dihydrochloride.

Examples of the organic peroxide include dicumyl peroxide, di-t-butyl peroxide, t-butyl peroxybenzoate, t-butyl hydroperoxide, benzoyl peroxide, cumene hydroperoxide, diisopropylbenzene hydroperoxide, p-menthane hydroperoxide, and di-t-butyl peroxide.

In the present invention, one kind of polymerization initiators to be incorporated into the curable composition may be used alone, or two or more kinds thereof may be used in combination. Here, when the step of curing the curable composition is based on light, the photopolymerization initiator is used as the initiator, and when the step is based on heat, the thermal polymerization initiator is used as the initiator. Of those initiators, the photopolymerization initiator is preferably used upon production of a film serving as a microstructure such as a semiconductor integrated circuit. This is because the use of the photopolymerization initiator eliminates the need for a thermal process such as heating or cooling in a production process for a cured film and hence leads to excellent productivity.

In the present invention, the content of the polymerization initiator in the curable composition, which is not particularly limited, is preferably 0.01 wt % or more and 10 wt % or less with respect to the weight (total weight) of the curable composition. The content is more preferably 0.1 wt % or more and 7 wt % or less, particularly preferably 1 wt % or more and 5 wt % or less. When the content falls within the range, both the curing speed of the curable composition and the strength (resin strength) of the film (cured film) are excellent.

(1B) Polymerizable Compound

Examples of the polymerizable compound include a radically polymerizable compound and a cationically polymerizable compound.

Although the radically polymerizable compound is not particularly limited as long as the compound has a radically polymerizable property, a compound having one or more acryloyl groups or methacryloyl groups is preferred.

Examples of monofunctional (meth)acrylic compounds having one acryloyl group or methacryloyl group include, but not limited to, phenoxyethyl(meth)acrylate, phenoxy-2-methylethyl(meth)acrylate, phenoxyethoxyethyl(meth)acrylate, 3-phenoxy-2-hydroxypropyl(meth)acrylate, 2-phenylphenoxyethyl(meth)acrylate, 4-phenylphenoxyethyl(meth)acrylate, 3-(2-phenylphenyl)-2-hydroxypropyl(meth)acrylate, EO-modified p-cumylphenyl(meth)acrylate, 2-bromophenoxyethyl(meth)acrylate, 2,4-dibromophenoxyethyl(meth)acrylate, 2,4,6-tribromophenoxyethyl(meth)acrylate, EO-modified phenoxy(meth)acrylate, PO-modified phenoxy(meth)acrylate, polyoxyethylene nonylphenyl ether (meth)acrylate, isobornyl(meth)acrylate, 1-adamantyl(meth)acrylate, 2-methyl-2-adamantyl(meth)acrylate, 2-ethyl-2-adamantyl(meth)acrylate, bornyl(meth)acrylate, tricyclodecanyl(meth)acrylate, dicyclopentanyl(meth)acrylate, dicyclopentenyl(meth)acrylate, cyclohexyl(meth)acrylate, 4-butylcyclohexyl(meth)acrylate, acryloyl morpholine, 2-hydroxyethyl(meth)acrylate, 2-hydroxypropyl(meth)acrylate, 2-hydroxybutyl(meth)acrylate, methyl(meth)acrylate, ethyl(meth)acrylate, propyl(meth)acrylate, isopropyl(meth)acrylate, butyl(meth)acrylate, amyl(meth)acrylate, isobutyl(meth)acrylate, t-butyl(meth)acrylate, pentyl(meth)acrylate, isoamyl(meth)acrylate, hexyl(meth)acrylate, heptyl(meth)acrylate, octyl(meth)acrylate, isooctyl(meth)acrylate, 2-ethylhexyl(meth)acrylate, nonyl(meth)acrylate, decyl(meth)acrylate, isodecyl(meth)acrylate, undecyl(meth)acrylate, dodecyl(meth)acrylate, lauryl(meth)acrylate, stearyl(meth)acrylate, isostearyl(meth)acrylate, benzyl(meth)acrylate, tetrahydrofurfuryl(meth)acrylate, butoxyethyl(meth)acrylate, ethoxy diethylene glycol (meth)acrylate, polyethylene glycol mono(meth)acrylate, polypropylene glycol mono(meth)acrylate, methoxy ethylene glycol (meth)acrylate, ethoxyethyl(meth)acrylate, methoxy polyethylene glycol (meth)acrylate, methoxy polypropylene glycol (meth)acrylate, diacetone (meth)acrylamide, isobutoxymethyl(meth)acrylamide, N,N-dimethyl(meth)acrylamide, t-octyl(meth)acrylamide, dimethylaminoethyl(meth)acrylate, diethylaminoethyl(meth)acrylate, 7-amino-3,7-dimethyloctyl(meth)acrylate, N,N-diethyl(meth)acrylamide, and N,N-dimethylaminopropyl(meth)acrylamide.

Examples of commercially available products corresponding to those monofunctional (meth)acrylic compounds include, but not limited to, Aronix M101, M102, M110, M111, M113, M117, M5700, 10-1317, M120, M150, and M156 (all of the above are manufactured by TOAGOSEI CO., LTD); MEDOL10, MIBDOL10, CHDOL10, MMDOL30, MEDOL30, MIBDOL30, CHDOL30, LA, IBXA, 2-MTA, HPA, and Viscoat #150, #155, #158, #190, #192, #193, #220, #2000, #2100, and #2150 (all of the above are manufactured by OSAKA ORGANIC CHEMICAL INDUSTRY LTD.); Light Acrylate BO-A, EC-A, DMP-A, THF-A, HOP-A, HOA-MPE, HOA-MPL, PO-A, P-200A, NP-4EA, and NP-8EA, and Epoxy Ester M-600A (all of the above are manufactured by KYOEISHA CHEMICAL Co., LTD); KAYARAD TC110S, R-564, and R-128H (all of the above are manufactured by NIPPON KAYAKU Co., Ltd.); NK Ester AMP-10G and AMP-20G (both of the above are manufactured by Shin-Nakamura Chemical Co., Ltd.); FA-511A, 512A, and 513A (all of the above are manufactured by Hitachi Chemical Co., Ltd.); PHE, CEA, PHE-2, PHE-4, BR-31, BR-31M, and BR-32 (all of the above are manufactured by Dai-ichi Kogyo Seiyaku Co., Ltd.); VP (manufactured by BASF); and ACMO, DMAA, and DMA-PAA (all of the above are manufactured by KOHJIN Co., Ltd.).

Examples of polyfunctional (meth)acrylic compounds having two or more acryloyl groups or methacryloyl groups include, but not limited to, trimethylolpropane di(meth)acrylate, trimethylolpropane tri(meth)acrylate, EO-modified trimethylolpropane tri(meth)acrylate, PO-modified trimethylolpropane tri(meth)acrylate, EO,PO-modified trimethylolpropane tri(meth)acrylate, pentaerythritol tri(meth)acrylate, pentaerythritol tetra(meth)acrylate, ethylene glycol di(meth)acrylate, tetraethylene glycol di(meth)acrylate, polyethylene glycol di(meth)acrylate, polypropylene glycol di(meth)acrylate, 1,4-butanediol di(meth)acrylate, 1,6-hexanediol di(meth)acrylate, neopentyl glycol di(meth)acrylate, tris(2-hydroxyethyl)isocyanurate tri(meth)acrylate, tris(acryloyloxy)isocyanurate, bis(hydroxymethyl)tricyclodecane di(meth)acrylate, dipentaerythritol penta(meth)acrylate, dipentaerythritol hexa(meth)acrylate, EO-modified 2,2-bis(4-((meth)acryloxy)phenyl)propane, PO-modified 2,2-bis(4-((meth)acryloxy)phenyl)propane, and EO,PO-modified 2,2-bis(4-((meth)acryloxy)phenyl)propane.

Examples of commercially available products corresponding to the polyfunctional (meth)acrylic compounds include, but not limited to, Upimer UV SA1002 and SA2007 (both of the above are manufactured by Mitsubishi Chemical Corporation); Viscoat #195, #230, #215, #260, #335HP, #295, #300, #360, #700, GPT, and 3PA (all of the above are manufactured by OSAKA ORGANIC CHEMICAL INDUSTRY LTD.); Light Acrylate 4EG-A, 9EG-A, NP-A, DCP-A, BP-4EA, BP-4PA, TMP-A, PE-3A, PE-4A, and DPE-6A (all of the above are manufactured by KYOEISHA CHEMICAL Co., LTD); KAYARAD PET-30, TMPTA, R-604, DPHA, DPCA-20, -30, -60, and -120, and HX-620, D-310, and D-330 (all of the above are manufactured by NIPPON KAYAKU Co., Ltd.); Aronix M208, M210, M215, M220, M240, M305, M309, M310, M315, M325, and M400 (all of the above are manufactured by TOAGOSEI CO., LTD); and Lipoxy VR-77, VR-60, and VR-90 (all of the above are manufactured by SHOWA HIGHPOLYMER CO., LTD.).

One kind of the radically polymerizable compounds listed above may be used alone, or two or more kinds thereof may be used in combination.

In the present invention, the term "(meth)acryl" means "acryl" and "methacryl". The term "(meth)acrylate" means "acrylate" and "methacrylate". The term "(meth)acryloyl" means "acryloyl" and "methacryloyl". The abbreviation "EO" refers to ethylene oxide, and the term "EO-modified compound" means a compound having at least one ethyleneoxy group. Further, the abbreviation "PO" refers to propylene oxide, and the term "PO-modified compound" means a compound having at least one propyleneoxy group.

Although the cationically polymerizable compound is not particularly limited as long as the compound has a cationically polymerizable property, a compound having one or more vinyl ether groups, epoxy groups, or oxetanyl groups is preferred.

Examples of compounds having one vinyl ether group include, but not limited to, methyl vinyl ether, ethyl vinyl ether, propyl vinyl ether, n-butyl vinyl ether, t-butyl vinyl ether, 2-ethylhexyl vinyl ether, n-nonyl vinyl ether, lauryl vinyl ether, cyclohexyl vinyl ether, cyclohexylmethyl vinyl ether, 4-methylcyclohexylmethyl vinyl ether, benzyl vinyl ether, dicyclopentenyl vinyl ether, 2-dicyclopentenoxyethyl vinyl ether, methoxyethyl vinyl ether, ethoxyethyl vinyl ether, butoxyethyl vinyl ether, methoxyethoxyethyl vinyl ether, ethoxyethoxyethyl vinyl ether, methoxy polyethylene glycol vinyl ether, tetrahydrofurfuryl vinyl ether, 2-hydroxyethyl vinyl ether, 2-hydroxypropyl vinyl ether, 4-hydroxybutyl vinyl ether, 4-hydroxymethylcyclohexylmethyl vinyl ether, diethylene glycol monovinyl ether, polyethylene glycol vinyl ether, chloroethyl vinyl ether, chlorobutyl vinyl ether, chloroethoxyethyl vinyl ether, phenylethyl vinyl ether, and phenoxy polyethylene glycol vinyl ether.

Examples of compounds having two or more vinyl ether groups include, but not limited to, divinyl ethers such as ethylene glycol divinyl ether, diethylene glycol divinyl ether, polyethylene glycol divinyl ether, propylene glycol divinyl ether, butylene glycol divinyl ether, hexanediol divinyl ether, a bisphenol A alkylene oxide divinyl ether, and a bisphenol F alkylene oxide divinyl ether; and polyfunctional vinyl ethers such as trimethylolethane trivinyl ether, trimethylolpropane trivinyl ether, ditrimethylolpropane tetravinyl ether, glycerin trivinyl ether, pentaerythritol tetravinyl ether, dipentaerythritol pentavinyl ether, dipentaerythritol hexavinyl ether, an ethylene oxide adduct of trimethylolpropane trivinyl ether, a propylene oxide adduct of trimethylolpropane trivinyl ether, an ethylene oxide adduct of ditrimethylolpropane tetravinyl ether, a propylene oxide adduct of ditrimethylolpropane tetravinyl ether, an ethylene oxide adduct of pentaerythritol tetravinyl ether, a propylene oxide adduct of pentaerythritol tetravinyl ether, an ethylene oxide adduct of dipentaerythritol hexavinyl ether, and a propylene oxide adduct of dipentaerythritol hexavinyl ether.

Examples of compounds having one epoxy group include, but not limited to, phenyl glycidyl ether, p-tert-butylphenyl glycidyl ether, butyl glycidyl ether, 2-ethylhexyl glycidyl ether, allyl glycidyl ether, 1,2-butylene oxide, 1,3-butadiene monooxide, 1,2-epoxydodecane, epichlorohydrin, 1,2-epoxydecane, styrene oxide, cyclohexene oxide, 3-methacryloyloxymethylcyclohexene oxide, 3-acryloyloxymethylcyclohexene oxide, and 3-vinylcyclohexene oxide.

Examples of compounds having two or more epoxy groups include, but not limited to, bisphenol A diglycidyl ether, bisphenol F diglycidyl ether, bisphenol S diglycidyl ether, brominated bisphenol A diglycidyl ether, brominated bisphenol F diglycidyl ether, brominated bisphenol S diglycidyl ether, an epoxy novolac resin, hydrogenated bisphenol A diglycidyl ether, hydrogenated bisphenol F diglycidyl ether, hydrogenated bisphenol S diglycidyl ether, 3,4-epoxycyclohexylmethyl-3',4'-epoxycyclohexane carboxylate, 2-(3,4-epoxycyclohexyl-5,5-spiro-3,4-epoxy)cyclohexane-meta-dioxane, bis(3,4-epoxycyclohexylmethyl) adipate, vinylcyclohexene oxide, 4-vinylepoxycyclohexane, bis(3,4-epoxy-6-methylcyclohexylmethyl) adipate, 3,4-epoxy-6-methylcyclohexyl-3',4'-epoxy-6'-methylcyclohexane carboxylate, methylene bis(3,4-epoxycyclohexane), dicyclopentadiene diepoxide, ethylene glycol di(3,4-epoxycyclohexylmethyl)ether, ethylene bis(3,4-epoxycyclohexane carboxylate), dioctyl epoxyhexahydrophthalate, di-2-ethylhexyl epoxyhexahydrophthalate, 1,4-butanediol diglycidyl ether, 1,6-hexanediol diglycidyl ether, glycerin triglycidyl ether, trimethylolpropane triglycidyl ether, polyethylene glycol diglycidyl ether, polypropylene glycol diglycidyl ethers, 1,1,3-tetradecadiene dioxide, limonene dioxide, 1,2,7,8-diepoxyoctane, and 1,2,5,6-diepoxycyclooctane.

Examples of compounds having one oxetanyl group include, but not limited to, 3-ethyl-3-hydroxymethyloxetane, 3-(meth)allyloxymethyl-3-ethyloxetane, (3-ethyl-3-oxetanylmethoxy)methylbenzene, 4-fluoro[1-(3-ethyl-3-oxetanylmethoxy)methyl]benzene, 4-methoxy[1-(3-ethyl-3-oxetanylmethoxy)methyl]benzene, [1-(3-ethyl-3-oxetanylmethoxy)ethyl]phenyl ether, isobutoxymethyl(3-ethyl-3-oxetanylmethyl)ether, isobornyloxyethyl(3-ethyl-3-oxetanylmethyl)ether, isobornyl(3-ethyl-3-oxetanylmethyl) ether, 2-ethylhexyl(3-ethyl-3-oxetanylmethyl)ether, ethyl diethylene glycol (3-ethyl-3-oxetanylmethyl)ether, dicyclopentadiene (3-ethyl-3-oxetanylmethyl)ether, dicyclopentenyloxyethyl(3-ethyl-3-oxetanylmethyl)ether, dicyclopentenyl(3-ethyl-3-oxetanylmethyl)ether, tetrahydrofurfuryl(3-ethyl-3-oxetanylmethyl)ether, tetrabromophenyl(3-ethyl-3-oxetanylmethyl)ether, 2-tetrabromophenoxyethyl(3-ethyl-3-oxetanylmethyl)ether, tribromophenyl(3-ethyl-3-oxetanylmethyl)ether, 2-tribromophenoxyethyl(3-ethyl-3-oxetanylmethyl)ether, 2-hydroxyethyl(3-ethyl-3-oxetanylmethyl)ether, 2-hydroxypropyl(3-ethyl-3-oxetanylmethyl)ether, butoxyethyl(3-ethyl-3-oxetanylmethyl)ether, pentachlorophenyl(3-ethyl-3-oxetanylmethyl)ether, pentabromophenyl(3-ethyl-3-oxetanylmethyl)ether, and bornyl(3-ethyl-3-oxetanylmethyl)ether.

Examples of compounds having two or more oxetanyl groups include, but not limited to, polyfunctional oxetanes such as 3,7-bis(3-oxetanyl)-5-oxa-nonane, 3,3'-(1,3-(2-methylenyl)propanediyl bis(oxymethylene))bis(3-ethyloxetane), 1,4-bis[(3-ethyl-3-oxetanylmethoxy)methyl]benzene, 1,2-bis[(3-ethyl-3-oxetanylmethoxy)methyl]ethane, 1,3-bis[(3-ethyl-3-oxetanylmethoxy)methyl]propane, ethylene glycol bis(3-ethyl-3-oxetanylmethyl)ether, dicyclopentenyl bis(3-ethyl-3-oxetanylmethyl)ether, triethylene glycol bis(3-ethyl-3-oxetanylmethyl)ether, tetraethylene glycol bis (3-ethyl-3-oxetanylmethyl)ether, tricyclodecanediyl dimethylene (3-ethyl-3-oxetanylmethyl)ether, trimethylolpropane tris(3-ethyl-3-oxetanylmethyl)ether, 1,4-bis(3-ethyl-3-oxetanylmethoxy)butane, 1,6-bis(3-ethyl-3-oxetanylmethoxy) hexane, pentaerythritol tris(3-ethyl-3-oxetanylmethyl)ether, pentaerythritol tetrakis(3-ethyl-3-oxetanylmethyl)ether, polyethylene glycol bis(3-ethyl-3-oxetanylmethyl)ether, dipentaerythritol hexakis(3-ethyl-3-oxetanylmethyl)ether, dipentaerythritol pentakis(3-ethyl-3-oxetanylmethyl)ether, dipentaerythritol tetrakis(3-ethyl-3-oxetanylmethyl)ether, caprolactone-modified dipentaerythritol hexakis(3-ethyl-3-oxetanylmethyl)ether, caprolactone-modified dipentaerythritol pentakis(3-ethyl-3-oxetanylmethyl)ether, ditrimethylolpropane tetrakis(3-ethyl-3-oxetanylmethyl)ether, EO-modified bisphenol A bis(3-ethyl-3-oxetanylmethyl) ether, PO-modified bisphenol A bis(3-ethyl-3-oxetanylmethyl)ether, EO-modified hydrogenated bisphenol A bis(3-ethyl-3-oxetanylmethyl)ether, PO-modified hydrogenated bisphenol A bis(3-ethyl-3-oxetanylmethyl)ether, and EO-modified bisphenol F (3-ethyl-3-oxetanylmethyl)ether.

One kind of those cationically polymerizable compounds may be used alone, or two or more kinds thereof may be used in combination. In addition, the term "hydrogenation" means the addition of a hydrogen atom to a C═C double bond of a benzene ring or the like.

In the present invention, the content of the polymerizable compound in the curable composition, which is not particularly limited, is preferably 80 wt % or more and 99.99 wt % or less with respect to the weight (total weight) of the curable composition. The content is more preferably 86 wt % or more and 99.89 wt % or less, particularly preferably 90 wt % or more and 98.9 wt % or less. When the content falls within the range, both the curing speed of the curable composition and the strength (resin strength) of the film (cured film) are excellent.

(1C) Internal Addition Type Release Agent

The internal addition type release agent is a compound having a hydrophilic functional group. Examples of the hydrophilic functional group include a polyoxyalkylene group having 2 to 3 carbon atoms, a hydroxyl group, a carboxyl group, an amino group, a pyridyl group, a thiol group, and a silanol group. In the present invention, a plurality of hydrophilic functional groups may be incorporated into a compound serving as the internal addition type release agent. In the present invention, the number of kinds of the hydrophilic functional groups to be incorporated into the internal addition type release agent may be one, or may be two or more.

Specific examples of the polyoxyalkylene group having 2 to 3 carbon atoms corresponding to the hydrophilic functional group include a polyoxyethylene group, a polyoxypropylene group, and a mixture thereof. In the present invention, when the polyoxyalkylene group is a mixture of a polyoxyethylene group and a polyoxypropylene group, the structure of the substituent itself may be a block structure or may be a random structure. A combination of the block structure and the random structure is also permitted.

Of those hydrophilic functional groups, a polyoxyethylene group, a hydroxyl group, a carboxyl group, or an amino group is preferred from the viewpoint of releasability, and a polyoxyethylene group, a hydroxyl group, or a carboxyl group is more preferred.

Examples of such preferred internal addition type release agent include an alkyl alcohol polyalkylene oxide adduct (such as a methyl alcohol ethylene oxide adduct, a decyl alcohol ethylene oxide adduct, a lauryl alcohol ethylene oxide adduct, a cetyl alcohol ethylene oxide adduct, a stearyl alcohol ethylene oxide adduct, or a stearyl alcohol ethylene oxide/propylene oxide adduct), and polyalkylene glycol (such as polyethylene glycol or polypropylene glycol). It should be noted that the terminal group of the alkyl alcohol polyalkylene oxide adduct is not limited to a hydroxyl group that can be produced simply by adding polyalkylene oxide to an alkyl alcohol. The hydroxyl group may be transformed into any other substituent, for example, a polar functional group such as a carboxyl group, an amino group, a pyridyl group, a thiol group, or a silanol group, or a hydrophobic functional group such as an alkyl group.

A commercially available product may be used as the internal addition type release agent. Examples of the commercially available product include polyoxyethylene methyl ether (methyl alcohol ethylene oxide adduct) manufactured by AOKI OIL INDUSTRIAL CO., LTD. (BLAUNON MP-400, BLAUNON MP-550, or BLAUNON MP-1000), polyoxyethylene decyl ether (decyl alcohol ethylene oxide adduct) manufactured by AOKI OIL INDUSTRIAL CO., LTD. (FINESURF D-1303, FINESURF D-1305, FINESURF D-1307, or FINESURF D-1310), polyoxyethylene methyl ether manufactured by BASF (Pluriol A760E), polyoxyethylene lauryl ether (lauryl alcohol ethylene oxide adduct) manufactured by AOKI OIL INDUSTRIAL CO., LTD. (BLAUNON EL-1505), polyoxyethylene cetyl ether (cetyl alcohol ethylene oxide adduct) manufactured by AOKI OIL INDUSTRIAL CO., LTD. (BLAUNON CH-305 or BLAUNON CH-310), polyoxyethylene stearyl ether (stearyl alcohol ethylene oxide adduct) manufactured by AOKI OIL INDUSTRIAL CO., LTD. (BLAUNON SR-705, BLAUNON SR-707, BLAUNON SR-715, BLAUNON SR-720, BLAUNON SR-730, or BLAUNON SR-750), polyethylene glycol manufactured by AOKI OIL INDUSTRIAL CO., LTD. (PEG-200, PEG-300, PEG-400, PEG-600, or PEG-1000), and random polymerization type polyoxyethylene polyoxypropylene stearyl ether manufactured by AOKI OIL INDUSTRIAL CO., LTD. (BLAUNON SA-50/50 1000R or BLAUNON SA-30/70 2000R).

Of those, an alkyl alcohol polyalkylene oxide adduct is preferred and a compound represented by the following general formula (A) (alkyl alcohol polyalkylene oxide adduct) is more preferred from the viewpoint of excellent releasability.

$$R\text{---}(OR')_n\text{---}X \quad (A)$$

In the formula (A), R represents an alkyl group, preferably an alkyl group having 1 to 50 carbon atoms, more preferably an alkyl group having 5 to 30 carbon atoms, particularly preferably an alkyl group having 10 to 20 carbon atoms. When the number of carbon atoms falls within this range, the releasability is more excellent.

In the formula (A), OR' represents an oxyalkylene group. That is, OR' represents a hydrophilic functional group. It should be noted that when n represents 2 or more, a plurality of R's may be identical to or different from each other. Of those, an oxyethylene group, an oxypropylene group, or a mixture of an oxyethylene group and an oxypropylene group is preferred, an oxyethylene group or a mixture of an oxyethylene group and an oxypropylene group is more preferred, and an oxyethylene group is particularly preferred from the viewpoint of adsorbing to the hydrophilic surface of a mold to improve the releasability.

In the formula (A), X represents a hydroxyl group or an oxyalkyl group, preferably a hydroxyl group or an oxyalkyl group having 1 to 8 carbon atoms, more preferably a hydroxyl group. When the number of carbon atoms falls within the range, the filling property of the curable composition is more excellent.

In the formula (A), n represents the repetition number of the oxyalkylene group (OR'), specifically represents an integer of from 1 to 100, preferably from 2 to 50, more preferably from 3 to 30, particularly preferably from 5 to 20. When n falls within this range, the solubility in the curable composition and the releasability are excellent. It should be noted that n may have a distribution. That is, a plurality of kinds of internal addition type release agents with the same factors except n (the kinds of R, R', and X) may be incorporated. An example in which n has a distribution is an alkyl alcohol polyalkylene oxide adduct having a molecular weight distribution.

The internal addition type release agent to be incorporated into the curable composition of the present invention is not unevenly distributed in the gas-liquid interface of the curable composition. This means that the internal addition type release agent dissolves in the curable composition in a substantially uniform manner. In other words, it means that the internal addition type release agent has substantially no action as a substance that changes the surface tension of the curable composition. The surface tension of the curable composition is described later. Further, the curable composition of the present invention satisfies the following general formula (1).

$$-5\% \leq \{(\gamma_1-\gamma_2)/\gamma_1\} \leq 5\% \quad (1)$$

In the formula (1), $\gamma_1$ represents the surface tension of a curable composition at 25° C. and $\gamma_2$ represents the surface tension of a curable composition for evaluation at 25° C. Here, the curable composition for evaluation refers to a composition having the same composition as that of the curable composition except that the curable composition for evaluation is free of any internal addition type release agent.

The relationship between the unevenly distributed state of the internal addition type release agent toward the gas-liquid interface and the surface tension of the curable composition is described below.

When a substance that is unevenly distributed in the gas-liquid interface like a surfactant is incorporated even in a small amount into the curable composition, the surface tension of the curable composition reduces. In the case of, for example, a fluorine-based surfactant having an oil-repellent functional group and a hydrophilic functional group, while the oil-repellent functional group appears at the gas-liquid interface, the hydrophilic functional group dissolves in the composition. As a result, the surface of the curable composition becomes oil-repellent and hence the surface tension reduces. Here, when the polymerizable compound is a (meth)acrylic compound constituted only of a carbon atom, a hydrogen atom, and an oxygen atom, a perfluoroalkyl group of the fluorine-based surfactant having the perfluoroalkyl group is oil-repellent but an alkyl group of the alkyl alcohol polyalkylene oxide adduct is not oil-repellent. This has been demonstrated in Examples to be described later.

On the other hand, even when a substance that is not unevenly distributed in the gas-liquid interface (substance that uniformly dissolves in the composition) is incorporated in a small amount into the curable composition, the surface tension of the curable composition itself shows substantially no change.

The reason why the requirement represented by the general formula (1) is required in the present invention is as follows: even when the internal addition type release agent is not unevenly distributed in the gas-liquid interface, the addition of the internal addition type release agent reflects the hydrophobicity (oil repellency) and hydrophilicity of the internal addition type release agent itself in the surface tension of the curable composition. As a result of extensive studies, the inventors of the present invention have found that even when the hydrophilicity or hydrophobicity (oil repellency) of the internal addition type release agent itself changes, as long as the curable composition satisfies the condition represented by the general formula (1), the internal addition type release agent is not unevenly distributed in the gas-liquid interface, and hence the filling speed is sufficiently fast and the releasing force reducing effect is excellent The lower limit of the ratio $(\gamma_1-\gamma_2)/\gamma_1$ in the general formula (1) is preferably −4% or more, more preferably −3% or more, particularly preferably −2% or more, most preferably −10 or more from the viewpoint of additionally increasing the filling speed.

On the other hand, when the upper limit of the ratio $(\gamma_1-\gamma_2)/\gamma_1$ in the general formula (1) exceeds 5%, the filling property is excellent but the hydrophilicity strengthens, and hence the interface bonding force with the mold having a hydrophilic surface tends to strengthen and the releasing force reducing effect tends to weaken. Therefore, the upper limit of the ratio $(\gamma_1-\gamma_2)/\gamma_1$ in the general formula (1) is preferably 4% or less, more preferably 3% or less, particularly preferably 2% or less, most preferably 1% or less.

The reason why the filling property is excellent when the internal addition type release agent is not unevenly distributed in the gas-liquid interface is described.

As described in NPL 1, a filling speed in a nanoimprint technology is known to be represented by the following general formula (i).

$$V = \frac{\gamma(\cos\theta_1 + \cos\theta_2)h_0^2}{12\,\mu L^2} \quad (i)$$

(V: filling speed, γ: surface tension of the curable composition, $\theta_1$: contact angle between mold surface and curable composition, $\theta_2$: contact angle between substrate and curable composition, p: viscosity of curable composition, $h_0$ and L: apparatus constants dependent on imprint apparatus)

As is apparent from the formula (1), the use of the internal addition type release agent that is unevenly distributed in the gas-liquid interface reduces the surface tension γ of a curable composition and hence slows the filling speed. Further, as a result of extensive studies, the inventors of the present invention have found that when the internal addition type release agent is unevenly distributed in the gas-liquid interface, while $\cos\theta_1$ and $\cos\theta_2$ tend to reduce, μ tends to increase. All of those changes act in the direction of reducing the filling speed. Therefore, the filling property is considered to deteriorate when the curable composition contains the internal addition type release agent that is unevenly distributed in the gas-liquid interface.

On the other hand, the use of the internal addition type release agent that is not unevenly distributed in the gas-liquid interface causes substantially no change in surface tension γ of the curable composition. Further, the inventors of the present invention have found that the use of the internal addition type release agent that is not unevenly distributed in the gas-liquid interface provides a filling speed faster than that in the case where the curable composition containing the internal addition type release agent that is unevenly distributed in the gas-liquid interface is used. A possible reason why the filling speed is fast is as follows: μ in the formula (i) is equal to that of the internal addition type release agent that is unevenly distributed in the gas-liquid interface, and γ, $\cos\theta_1$, and $\cos\theta_2$ in the formula (i) are substantially equal to those in the case where no internal addition type release agent is incorporated.

In the present invention, not only the general formula (1) but also the following general formula (2) is preferably satisfied.

$$\gamma_1 \cos\theta \geq 30\ \mathrm{mJ/m^2} \quad (2)$$

In the formula (2), $\gamma_1$ represents the surface tension of a curable composition at 25° C., and θ represents the contact angle between a mold and the curable composition. In the present invention, θ is preferably as close to 0° as possible. That is, cos θ is preferably as close to 1 as possible. Not only the requirement represented by the general formula (1) but also the requirement represented by the general formula (2) is preferably satisfied because the filling property into a recessed portion of the mold in the nanoimprint technology is further excellent. $\gamma_1 \cos\theta$ is more preferably 32 mJ/m² or more, particularly preferably 32.5 mJ/m² or more. It should be noted that the upper limit of $\gamma_1 \cos\theta$ is $\gamma_1$.

A possible mechanism via which the incorporation of the internal addition type release agent reduces the releasing force of the curable composition can be as described below.

When the curable composition and the mold are brought into contact with each other in a contact step, the following phenomenon occurs during the movement of the internal addition type release agent in the curable composition by thermal motion: a hydrophilic functional group of the internal addition type release agent and the hydrophilic surface of the mold adsorb to each other by virtue of an intermolecular force such as a hydrogen bond. When this phenomenon is repeated, the internal addition type release agent is gradually accumulated on the surface of the mold with a lapse of time to form an internal addition type release agent layer. The formation of the internal addition type release agent layer may be accelerated in a curing step because the formation is influenced by the thermal motion of the internal addition type release agent. For example, in the case of photocuring, the formation may be accelerated by exposure heat or polymerization heat in association with a curing reaction, and in the case of thermal curing, the formation may be accelerated by an increase in temperature caused by heating.

In a releasing step, the internal addition type release agent layer is present between a cured film before the releasing step and the mold. Here, the internal addition type release agent layer has only to cover at least part of the hydrophilic surface of the mold in contact with the cured film. In other words, the internal addition type release agent layer may cover the entirety of the hydrophilic surface of the mold, or may cover part of the hydrophilic surface of the mold.

When the internal addition type release agent layer covers the entire surface of the mold, an interface between the mold and the cured film is constituted of an interface between the cured film and the internal addition type release agent layer and of an interface between the internal addition type release agent layer and the mold. When the internal addition type release agent layer covers part of the hydrophilic surface of the mold, the interface between the mold and the cured film is constituted of an interface between the mold and the cured film, the interface between the cured film and the internal addition type release agent layer, and the interface between the internal addition type release agent layer and the mold.

The interface to be released in the releasing step may be one or more kinds of interfaces selected from the group consisting of the interface between the mold and the cured film, the interface between the cured film and the internal addition type release agent layer, and the interface between the internal addition type release agent layer and the mold as well as an interface to be newly produced by the fracture of the inside of the internal addition type release agent layer. Of those interfaces, the interface having a weak cohesive force is considered to tend to be easily released. Here, examples of the interface having a weak cohesive force include the interface between the cured film and the internal addition type release agent layer, and the interface to be newly produced by the fracture of the inside of the internal addition type release agent layer. However, the interface to be released in the present invention is not particularly limited.

Therefore, in the present invention, the cohesive force of each of the interface between the cured film and the internal addition type release agent layer and the interface to be newly produced by the fracture of the inside of the internal addition type release agent layer is preferably weak. The internal addition type release agent is preferably a compound free of any polymerizable functional group from the viewpoint of weakening the cohesive forces of those interfaces. When the internal addition type release agent is a compound having a polymerizable functional group, the following tendency is observed: a covalent bond is produced between the molecules of the internal addition type release agent or between the internal addition type release agent and the cured film to strengthen a cohesive force between the molecules of the internal addition type release agent and the cohesive force between the internal addition type release agent and the cured film. On the other hand, when the internal addition type release agent is free of any polymerizable functional group, no covalent bonds are produced between the molecules of the internal addition type release agent and between the internal addition type release agent and the cured film, and hence the cohesive force between the molecules of the internal addition type release agent and the cohesive force between the internal addition type release agent and the cured film weaken. As a result, the releasing force reduces.

Although the content of the internal addition type release agent in the curable composition of the present invention is not particularly limited as long as the content falls within such a range that the condition represented by the general formula (1) is satisfied, the content is preferably from 0.001 wt % to 10 wt % with respect to the weight of the curable composition from such a viewpoint that not only the filling property but also the releasing force reducing effect is excellent. The content is more preferably from 0.01 wt % to 7 wt %, particularly preferably from 0.1 wt % to 5 wt %.

As described above, the curable composition of the present invention contains the polymerization initiator, the polymerizable compound, and the internal addition type release agent having a hydrophilic functional group. However, the composition may contain an additive in addition to the three components depending on various purposes to the extent that the effects of the present invention are not impaired. For example, a sensitizer to be described later may be incorporated as an additive into the curable composition of the present invention.

In addition, an antioxidant, a polymer component, or the like may be incorporated as an additive together with the sensitizer or instead of the sensitizer. Those additives are described below.

(1E) Sensitizer

The incorporation of the sensitizer tends to accelerate the polymerization reaction and to increase the polymerization conversion rate. Examples of the sensitizer include a hydrogen donor and a sensitizing dye.

The hydrogen donor is a compound which donates hydrogen to initiation radicals generated from the polymerization initiator or to radicals of a polymerization growth terminal, and hence the hydrogen donor itself generates radicals. The addition of the hydrogen donor when the polymerization initiator is a photoradical generator may increase the polymerization rate.

Specific examples of the hydrogen donor include, but not limited to, N-butylamine, di-n-butylamine, tri-n-butylphosphine, allylthiourea, s-benzylisothiuronium-p-toluenesulfinate, triethylamine, diethylaminoethyl methacrylate, triethylenetetramine, 4,4'-bis(dialkylamino)benzophenone, N,N-dimethylaminobenzoic acid ethyl ester, N,N-dimethylaminobenzoic acid isoamyl ester, pentyl-4-dimethylaminobenzoate, triethanolamine, N-phenylglycine, and other amine compounds, 2-mercapto-N-phenylbenzimidazole, mercaptopropionic acid ester, and other mercapto compounds. It should be noted that a specific example of the 4,4'-bis(dialkylamino)benzophenone is 4,4'-bis(diethylamino)benzophenone.

The sensitizing dye is a compound that is excited by absorbing light having a specific wavelength to act on a photopolymerization initiator. The term "action" as used herein refers to, for example, the transfer of energy or an electron from the sensitizing dye in an excited state to the photopolymerization initiator. The addition of the sensitizer when the photopolymerization initiator is a photoradical generator may increase the polymerization rate.

Specific examples of the sensitizing dye include, but not limited to, an anthracene derivative, an anthraquinone derivative, a pyrene derivative, a perylene derivative, a carbazole derivative, a benzophenone derivative, a thioxanthone derivative, a xanthone derivative, a thioxanthone derivative, a coumarin derivative, a phenothiazine derivative, a camphorquinone derivative, an acridine-based dye, a thiopyrylium salt-based dye, a merocyanine-based dye, a quinoline-based dye, a styrylquinoline-based dye, a ketocoumarin-based dye, a thioxanthene-based dye, a xanthene-based dye, an oxonol-based dye, a cyanine-based dye, a rhodamine-based dye, and a pyrylium salt-based dye.

One kind of the sensitizers may be used alone, or two or more kinds thereof may be used as a mixture.

When the curable composition of the present invention contains the sensitizer, the content of the sensitizer is preferably 10 wt % or less with respect to the weight of the polymerizable compound. The content is more preferably from 0.1 wt % to 5 wt %. Here, setting the content of the sensitizer to 0.1 wt % or more enables the sensitizer to exhibit its effect in an additionally effective manner. In addition, setting the content of the sensitizer to 10 wt % or less tends to make the solubility and storage stability of the composition excellent.

The polymer component may be incorporated into the curable composition of the present invention. The term "polymer component" as used herein comprehends a (meth)acrylic polymer (such as polymethyl methacrylate) and a vinyl polymer (such as polystyrene), which include the polymerizable compound as a constituent unit. It should be noted that the polymer component may be a copolymer.

Next, a suitable condition upon preparation of the curable composition is described.

Temperature at the Time of Blending of Curable Composition

The curable composition is prepared by mixing and dissolving the initiator, the polymerizable compound, and the internal addition type release agent under a predetermined temperature condition. The preparation is performed at a temperature in the range of preferably from 0° C. to 100° C., more preferably from 10° C. to 50° C. from the viewpoint of, for example, workability.

Viscosity of Curable Composition

The viscosity of the curable composition of the present invention at 25° C. is preferably from 1 mPa·s to 100 mPa·s, more preferably from 5 mPa·s to 50 mPa·s, still more preferably from 6 mPa·s to 20 mPa·s. When the viscosity of the curable composition is more than 100 mPa·s, in the case where the curable composition is used in nanoimprint lithography, it may require a long time period to fill the curable composition into a recessed portion of a fine pattern on the mold upon contact of the composition with the mold, or a pattern defect may occur owing to insufficient filling. On the other hand, when the viscosity is less than 1 mPa·s, application unevenness may occur upon application of the curable composition, or the photocurable composition may flow out of an end portion of the mold upon contact of the curable composition with the mold.

Surface Tension of Curable Composition

The curable composition of the present invention has a surface tension at 25° C. of preferably from 5 mN/m to 70 mN/m, more preferably from 7 mN/m to 35 mN/m, still more preferably from 10 mN/m to 35 mN/m, particularly preferably from 30 mN/m to 35 mN/m, most preferably from 32 mN/m to 35 mN/m. Here, when the surface tension is less than 5 mN/m, it requires a long time period to fill the curable composition into a recessed portion of a fine pattern on the mold upon contact of the composition with the mold. On the other hand, when the surface tension is more than 70 mN/m, the surface smoothness becomes low.

Impurities Such as Particle Included in Curable Composition

Impurities such as particles are desirably removed from the curable composition of the present invention to the extent possible. For example, in order that the defect of a pattern can be prevented from occurring owing to undesirably generated irregularities in a photo-cured product due to particles included in the curable composition, impurities such as the particle are desirably removed. Specifically, it is preferred that the respective components in the curable composition be mixed and then the mixture be filtered with a filter having a pore diameter of, for example, from 0.001 µm to 5.0 µm. It is more preferred that the filtration with the filter be performed in multiple stages or be repeated multiple times. In addition, the filtered liquid may be filtered again. A filter made of, for example, a polyethylene resin, polypropylene resin, fluororesin, or nylon resin can be used as the filter to be used in the filtration. However, the filter is not particularly limited thereto.

It should be noted that upon use of the curable composition of the present invention for the manufacture of a semiconductor integrated circuit, the amount of metal impurities included in the composition is preferably reduced to the extent possible in order that the operation of a product is not inhibited. Accordingly, in the curable composition of the present invention, the concentration of the metal impurities in the composition is set to preferably 10 ppm or less, more preferably 100 ppb or less.

(2) Method of Producing Film (Cured Film)

Next, a method of producing a film (cured film) of the present invention is described. It should be noted that the term "method of producing a film" as used in the present invention comprehends an imprint method. Examples of the imprint method include an optical imprint method involving curing with light and a thermal imprint method involving curing with heat.

The imprint method is preferably defined as a method of forming a pattern having a size of from 1 nm to 10 mm. The method more preferably means a method of forming a pattern having a size of from about 10 nm to 100 µm. Meanwhile, a pattern formation technology for forming a pattern (irregular structure) having a nanosize (of from 1 nm to 100 nm) is generally called nanoimprinting, and the nanoimprint method is of course included in the method of producing a film of the present invention.

Figure 1C:
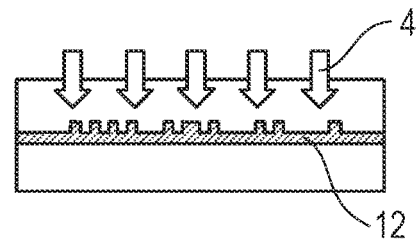
Figure 1D:
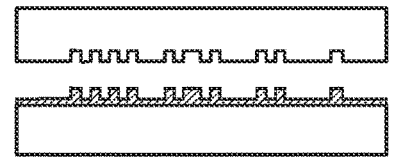
Figure 1E:
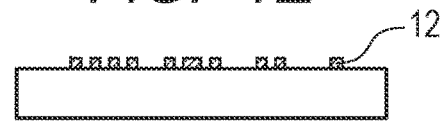
Figure 1F:

FIGS. 1A to 1F are schematic sectional views illustrating an example of a method of producing a film according to an embodiment of the present invention. A production process illustrated in FIGS. 1A to 1F is a production process including steps according to the following items [1] to [5] or [6]:

[1] a placing step (applying step, FIG. 1A);
[2] a mold contact step (FIGS. 1B1 and 1B2);
[3] a curing step (FIG. 1C);
[4] a releasing step (FIG. 1D);
[5] a remaining film removal step (FIG. 1E); and
[6] a substrate processing step (FIG. 1F).

Through the steps according to the above-mentioned items [1] to [6] (or the steps according to the above-mentioned items [1] to [5]), a cured product 12 and an electronic component (electronic device) or optical component including the cured product 12 can be obtained from the curable composition 1. Hereinafter, details about the respective steps are described.

<Placing Step (FIG. 1A)>

First, the curable composition 1 is placed (applied) on a substrate 2 to form an applied film (FIG. 1A). The term "curable composition" as used herein refers to the curable composition of the present invention.

A silicon wafer is generally used for the substrate to be processed corresponding to the substrate 2, but the material for the substrate is not limited thereto. In addition to the silicon wafer, there may be used a material arbitrarily selected from any known materials for a substrate of a semiconductor device such as aluminum, a titanium-tungsten alloy, an aluminum-silicon alloy, an aluminum-copper-silicon alloy, silicon oxide, and silicon nitride. It should be noted that as the substrate to be used (substrate to be processed), there may be used a substrate whose adhesion property to a curable composition is improved by surface treatment such as silane coupling treatment, silazane treatment or formation of an organic thin film.

As a method of placing the curable composition of the present invention on the substrate to be processed, there may be used, for example, an ink jet method, a dip coating method, an air knife coating method, a curtain coating method, a wire bar coating method, a gravure coating method, an extrusion coating method, a spin coating method, or a slit scanning method. It should be noted that the thickness of the shape transfer layer (applied film) varies depending on the application, and is, for example, from 0.01 µm to 100.0 µm.

<Mold Contact Step (FIGS. 1B1 and 1B2)>

Next, the step of bringing the mold into contact with the applied film formed of the curable composition 1 formed in the preceding step (placing step) (mold contact step, FIGS. 1B1 and 1B2) is performed. It should be noted that the step is also called an impressing step because the mold 3 is considered as a stamp. When the mold 3 is brought into contact with the curable composition 1 (shape transfer layer) in the step (FIG. 1B1), a recessed portion of the fine pattern formed on the mold 3 is filled with (part of) the applied film 11 (FIG. 1B2).

The mold 3 to be used in the mold contact step needs to be constituted of an optically transparent material when the next step (curing step) is a photocuring step using light. Glass, quartz, an optically transparent resin such as PMMA or a polycarbonate resin, a transparent metal-deposited film, a flexible film made of polydimethylsiloxane or the like, a photo-cured film, and a metal film can be given as specific examples of the constituent material for the mold 3. When an optically transparent resin is used as a constituent material for the mold 3, it is necessary to choose a resin which does not dissolves in the curable composition 1. On the other hand, when the curing step is a thermal curing step, the transparency of the material is not limited and the materials described above can be used as the constituent material for the mold 3.

The mold 3 to be used in the mold contact step has a hydrophilic surface.

The term "hydrophilic surface" means that the surface of the mold 3 is more hydrophilic than the polymerizable compound, and preferably means that the surface of the mold 3 is a surface having a hydrophilic functional group such as a hydroxyl group or a carboxyl group.

In the case where the mold 3 is quartz, glass, or the like, its surface is a hydrophilic surface even when the surface is not treated, but the surface is preferably subjected to hydrophilic treatment because its hydrophilicity can be additionally improved. Examples of the hydrophilic treatment include UV cleaning, UV/ozone cleaning, and Piranha cleaning (such as cleaning with an acid obtained by mixing sulfuric acid and hydrogen peroxide water). It should be noted that the method for the hydrophilic treatment is not limited to a method of performing one of the above-mentioned treatments, and a method involving performing two or more of the above-mentioned treatment methods in combination is of course included in the present invention. When the hydrophilicity of the surface of the substrate is improved as described above, the internal addition type release agent is unevenly distributed in the interface of the mold with ease and hence its releasability additionally improves.

When the mold is an optically transparent resin such as PMMA or a polycarbonate resin, treating the surface through, for example, cleaning treatment based on UV cleaning or UV/ozone cleaning can result in the formation of a surface having hydrophilicity.

Of those molds 3, quartz is preferred from such a viewpoint that the hydrophilicity of its surface is high. Quartz whose surface has been subjected to hydrophilic treatment is more preferred. In addition, when the mold is quartz, the mold is suitable for a method of producing a film in which the curing step is a photocuring step such as nanoimprint lithography because both of its light permeability and hydrophilicity are excellent.

The pressure to be applied to the curable composition 1 when the mold 3 is brought into contact with the curable composition 1 in the mold contact step as illustrated in FIG. 1B1, which is not particularly limited, is typically from 0.1 MPa to 100 MPa. Of such range, a pressure of from 0.1 MPa to 50 MPa is preferred, a pressure of from 0.1 MPa to 30 MPa is more preferred, and a pressure of from 0.1 MPa to 20 MPa is still more preferred. In addition, the time period for which the mold 3 is brought into contact with the shape transfer layer 1 in the mold contact step, which is not particularly limited, is typically from 1 second to 600 seconds, preferably from 1 second to 300 seconds, more preferably from 1 second to 180 seconds, particularly preferably from 1 second to 120 seconds.

In addition, examples of the atmosphere under which the mold contact step is performed include an air atmosphere, a reduced pressure atmosphere, and an inert gas atmosphere. Here, the pressure of the atmosphere under which the mold contact step is performed is not particularly limited and can be appropriately set within the range of, for example, from 0.0001 atmospheric pressure to 10 atmospheric pressures.

When the mold contact step is performed under an inert gas atmosphere, specific examples of the inert gas to be used include nitrogen, carbon dioxide, helium, argon, various fluorocarbon gases, and a mixed gas thereof. Helium is preferred for use in nanoimprinting.

In the case where helium is used as the inert gas, when the inert gas in the atmosphere is filled into a recessed portion of the fine pattern formed on the mold 3 together with part of the applied film 11 in the mold contact step, the inert gas can permeate and escape from the mold. Accordingly, the filling property of the curable composition 1 into the recessed portion of the mold 3 is excellent.

A condensable gas atmosphere can also be used as the atmosphere under which the mold contact step is performed. In the present invention, the condensable gas atmosphere refers to a gas atmosphere containing a condensable gas and the gas atmosphere may contain a gas in addition to the condensable gas. The condensable gas refers to a gas satisfying the following requirements (i) and (ii):

(i) the gas is present as a gas in the atmosphere at a stage before the contact between the curable composition 1 (shape transfer layer) and the mold 3 (FIG. 1B1) in the mold contact step; and (ii) when the curable composition 1 and the mold 3 are brought into contact with each other, and hence the gas in the atmosphere is filled into the recessed portion of the fine pattern formed on the mold 3, and a gap between the mold and the substrate together with (part of) the applied film 11, the gas condenses by virtue of a capillary pressure produced by a pressure at the time of the filling to liquefy.

Here, when the mold contact step is performed under the condensable gas atmosphere, the gas filled into the recessed portion of the fine pattern liquefies and hence air bubbles disappear. Accordingly, the filling property of the curable composition 1 into the recessed portion of the mold 3 is excellent. It should be noted that the condensable gas may be dissolved in the curable composition.

Although the boiling point of the condensable gas is not limited as long as the boiling point is equal to or less than the ambient temperature of the mold contact step, the boiling point is preferably from −10° C. to 23° C., more preferably from 10° C. to 23° C. When the boiling point falls within the temperature range, the filling property of the curable composition 1 into the recessed portion of the mold 3 is more excellent.

Although the vapor pressure of the condensable gas at the ambient temperature in the mold contact step is not limited as long as the vapor pressure is equal to or less than the mold pressure when impression is performed in the mold contact step, the vapor pressure is preferably from 0.1 MPa to 0.4 MPa. When the vapor pressure falls within this range, the filling property of the curable composition 1 into the recessed portion of the mold 3 is more excellent. Here, when the vapor pressure at the ambient temperature is more than 0.4 MPa, such a tendency that an air bubble disappearing effect cannot be sufficiently obtained is observed. On the other hand, when the vapor pressure at the ambient temperature is less than 0.1 MPa, such a tendency that decompression is needed and hence an apparatus becomes complicated is observed.

The ambient temperature in the mold contact step, which is not particularly limited, is preferably from 20° C. to 25° C.

Specific examples of the condensable gas include fluorocarbons including a chlorofluorocarbon (CFC) such as trichlorofluoromethane; a fluorocarbon (FC); a hydrochlorofluorocarbon (HCFC); a hydrofluorocarbon (HFC) such as 1,1,1,3,3-pentafluoropropane ($CHF_2CH_2CF_3$, HFC-245fa, PFP); and a hydrofluoroether (HFE) such as pentafluoroethyl methyl ether ($CF_3CF_2OCH_3$, HFE-245mc).

Of those condensable gases, the compounds listed below are preferred from such a viewpoint that when the ambient temperature of the mold contact step is from 20° C. to 25° C., the filling property of the curable composition 1 into the recessed portion of the mold 3 is excellent.

1,1,1,3,3-Pentafluoropropane (vapor pressure at 23° C.: 0.14 MPa, boiling point: 15° C.)

Trichlorofluoromethane (vapor pressure at 23° C.: 0.1056 MPa, boiling point: 24° C.)

Pentafluoroethyl methyl ether

Of those, 1,1,1,3,3-pentafluoropropane is particularly preferred from the viewpoint of being excellent in safety.

One kind of the condensable gases may be used alone, or two or more kinds thereof may be used as a mixture. In addition, such condensable gas may be mixed with a non-condensable gas such as air, nitrogen, carbon dioxide, helium, or argon before use. The non-condensable gas to be mixed with the condensable gas is preferably helium from the viewpoint of the filling property. In the case of helium, even when helium is used as a mixed gas obtained by mixing the condensable gas and the non-condensable gas (helium), helium permeates the mold and hence the filling property is excellent.

Of those atmospheres, the reduced pressure atmosphere, the inert gas atmosphere, or the condensable gas atmosphere is preferred because an influence of oxygen or moisture on a curing reaction can be prevented irrespective of whether the curing step is a photocuring step or a thermal curing step.

Curing Step (FIG. 1C)

Next, the applied film is cured. Specifically, the applied film 11 is irradiated with light through the mold 3 (FIG. 1C) or the applied film 11 is heated. In the curing step, the applied film 11 is cured with light or heat to form the cured film 12.

When the applied film 11 is cured with light, the light with which the curable composition 1 constituting the applied film 11 is irradiated is selected in accordance with the sensitivity wavelength of the curable composition 1. Specifically, it is preferred that ultraviolet light having a wavelength of from about 150 nm to 400 nm, an X-ray, an electron beam, or the like be appropriately selected and used. Here, many of the compounds commercially available as photopolymerization initiators have sensitivity to ultraviolet light. Accordingly, the light with which curable composition 1 is irradiated (irradiation light 4) is particularly preferably ultraviolet light. Here, examples of the light source of ultraviolet light include a high-pressure mercury lamp, an ultra-high pressure mercury lamp, a low-pressure mercury lamp, a Deep-UV lamp, a carbon arc lamp, a chemical lamp, a metal halide lamp, a xenon lamp, a KrF excimer laser, an ArF excimer laser, and a $F_2$ excimer laser. Of those, an ultra-high pressure mercury lamp is particularly preferred. The number of the light sources to be used may be one or more. Further, when the curable composition 1 is irradiated with light, the entire surface thereof may be irradiated with light, or a part of the surface thereof may be irradiated with light. In addition, when a photopolymerization initiator and a thermal polymerization initiator are used in combination, thermal curing may be further performed in addition to the photoirradiation. The order in which the photocuring and the thermal curing are performed is not limited, and the case where the thermal curing is performed after the photocuring, the case where the photocuring is performed after the thermal curing, and the case where the photocuring and the thermal curing are simultaneously performed are mentioned.

In the case of the thermal curing, the heating atmosphere, the heating temperature, and the like are not particularly limited. For example, under an inert atmosphere or under reduced pressure, the curable composition 1 can be heated at a temperature in the range of from 40° C. to 200° C. In addition, a hot plate, an oven, a furnace, or the like can be used upon heating of the shape transfer layer (applied film 11).

Releasing Step (FIG. 1D)

Next, the step of releasing the mold 3 from the cured film 12 to form a cured film having a predetermined pattern shape on the substrate 2 (releasing step, FIG. 1D) is performed. This step (releasing step) is a step of releasing the mold 3 from the cured film 12, and a reverse pattern of the fine pattern formed on the mold 3 in the preceding step (curing step) is obtained as a pattern of the cured film 12. It should be noted that the internal addition type release agent may be such that the agent adsorbs to an interface at which the curable composition or the cured film and the mold are in contact with each other during the time period from the contact of the mold with the curable composition to the release of the mold from the cured film.

In addition, when the mold contact step is performed under the condensable gas atmosphere, the following tendency is observed: the condensable gas vaporizes in association with a reduction in pressure at the interface at which the cured film and the mold are in contact with each other upon release of the mold from the cured film in the releasing step, and hence a releasing force reducing effect is exhibited.

The method of releasing the mold 3 from the cured film 12 is not particularly limited as long as part of the cured film 12 does not physically fracture during the release, and various conditions for the release and the like are also not particularly limited. For example, the mold 3 may be released as described below. The substrate to be processed (substrate 2) is fixed and the mold 3 is moved so that the mold goes away from the substrate to be processed. Alternatively, the mold 3 may be released as described below. The mold is fixed and the substrate to be processed is moved so that the substrate goes away from the mold. Alternatively, the mold may be released by pulling both the substrate and the mold in directions diametrically opposed to each other.

Remaining Film Removal Step (FIG. 1E)

Although the cured film to be obtained when the releasing step is performed has a specific pattern shape, part of the film may be present as a remaining film even in a region except the region in which the pattern shape is formed. In view of the foregoing, the step of removing the cured film (remaining film) remaining in a region from which the cured product should be removed out of the pattern shape (remaining film removal step, FIG. 1E) is performed.

Here, the method of removing the remaining film is, for example, a method involving removing the film (remaining film) remaining in a recessed portion of the cured film 12 by etching to expose the surface of the substrate 2 in the recessed portion of the pattern.

When the etching is utilized, its specific method therefor is not particularly limited and a desired pattern shape can be formed by a conventionally known method, for example, by performing dry etching. A conventionally known dry etching apparatus can be used in the dry etching. In addition, a source gas at the time of the dry etching is appropriately selected depending on the elemental composition of a film to be etched. For example, a halogen-based gas such as $CF_4$, $C_2F_6$, $C_3F_8$, $CCl_2F_2$, $CCl_4$, $CBrF_3$, $BCl_3$, $PCl_3$, $SF_6$, or $Cl_2$, a gas containing an oxygen atom such as $O_2$, CO, or $CO_2$, an inert gas such as He, $N_2$, or Ar, or a gas of $H_2$ or $NH_3$ can be used. It should be noted that those gases can be used as a mixture.

The cured film 12 having a desired irregular pattern shape (pattern shape attributable to the irregular shape of the mold 3) can be obtained by the production process including the steps [1] to [5]. Here, when the substrate 2 is processed by utilizing the cured film 12, the step of processing the substrate to be described later is further performed in some cases.

Meanwhile, the resultant cured film 12 can be utilized as an optical member (the case where the product is used as a member of the optical member is included). In such case, an optical member including at least the substrate 2 and the cured film 12 placed on the substrate 2 can be provided.

Substrate Processing Step (FIG. 1F)

The cured film 12 having a desired irregular pattern shape obtained by the production method of the present invention can be utilized as, for example, a film for an interlayer insulating film in an electronic component typified by a semiconductor element such as an LSI, a system LSI, a DRAM, an SDRAM, an RDRAM, or a D-RDRAM. Meanwhile, the cured film 12 can also be utilized as a resist film at the time of the manufacture of a semiconductor element.

When the cured film 12 is utilized as a resist film, specifically, part of the substrate whose surface has been exposed by the etching step (region represented by reference numeral 20) is subjected to, for example, etching or ion implantation as illustrated in FIG. 1F. It should be noted that at this time, the cured film 12 functions as a mask. Thus, a circuit structure (not shown) based on the pattern shape of the cured film 12 can be formed on the substrate 2. Thus, a substrate with a circuit to be utilized in a semiconductor element or the like can be manufactured. It should be noted that an electronic component is formed by providing an electronic member for the substrate with a circuit.

It should be noted that when the substrate with a circuit or the electronic component is produced, the pattern of the cured film may be finally removed from the processed substrate, but such a construction that the pattern is left as a constituent member of an element is also preferred.

As can be understood from the foregoing, the curable composition of the present invention is excellent for use in imprinting because of its excellent filling speed and excellent releasing force reducing effect. In particular, the composition is significantly excellent for use in nanoimprinting for forming a pattern having a nanosize (of from 1 nm to 100 nm).

The method of producing a film of the present invention is excellent in filling speed of the curable composition and is excellent in releasing force reducing effect of a cured film. Therefore, when the method of producing a film of the present invention is employed in, for example, nanoimprint lithography, the filling property is excellent and hence high productivity is obtained. Further, the composition contains the internal addition type release agent, and hence its releasing force reduces and a pattern defect in association with release can be reduced.

EXAMPLES

Hereinafter, the present invention is described in more detail by way of Examples, but the technical scope of the present invention is not limited to Examples to be described below. Further, the term "part(s)" to be used in the following description refers to a unit on a weight basis (part(s) by weight) in all cases unless otherwise stated.

Listed below are reagents (a polymerization initiator, a polymerizable compound, and an internal addition type release agent) used in any one of Examples and Comparative Examples and contained in a curable composition.

(A) Polymerization Initiator
<A1> IRGACURE 651 (manufactured by BASF)
<A2> IRGACURE 369 (manufactured by Ciba Japan Co.)
<A3> Lucirin TPO (manufactured by BASF)
(B) Polymerizable Compound
<B1> Isobornyl acrylate (manufactured by Kyoeisha Chemical Co., Ltd., trade name: IB-XA)
<B2> Benzyl acrylate (manufactured by Osaka Organic Chemical Industry Ltd., trade name: V#160)
<B3> Neopentyl glycol diacrylate (manufactured by Kyoeisha Chemical Co., Ltd., trade name: NP-A)

(C) Internal Addition Type Release Agent
<C1> Polyoxyethylene stearyl ether (EO (5 mol) adduct) (manufactured by AOKI OIL INDUSTRIAL CO., LTD., trade name: BLAUNON SR-705)
<C2> Polyoxyethylene stearyl ether (EO (30 mol) adduct) (manufactured by AOKI OIL INDUSTRIAL CO., LTD., trade name: BLAUNON SR-730)
<C3> Polyoxyethylene stearyl ether (EO (15 mol) adduct) (manufactured by AOKI OIL INDUSTRIAL CO., LTD., trade name: BLAUNON SR-715)
<C4> Pentadecaethylene glycol mono-1H,1H,2H,2H-perfluorooctyl ether $(F(CF_2)_6CH_2CH_2(OCH_2CH_2)_{15}OH)$ (manufactured by DIC Corporation)
<C5> Polyoxyethylene stearyl ether (EO (50 mol) adduct) (manufactured by AOKI OIL INDUSTRIAL CO., LTD., trade name: BLAUNON SR-750)
<C6> Polyoxyethylene polyoxypropylene stearyl ether (manufactured by AOKI OIL INDUSTRIAL CO., LTD., trade name: BLAUNON SA-50/50 1000R, EO/PO=50/50)
<C7> Polyoxyethylene polyoxypropylene stearyl ether (manufactured by AOKI OIL INDUSTRIAL CO., LTD., trade name: BLAUNON SA-30/70 2000R, EO/PO=30/70)
<C8> Polyoxyethylene methyl ether: Pluriol A760E (manufactured by BASF, Pluriol A760E)
(E) Sensitizer
<E1> 4,4'-Bis(diethylamino)benzophenone (manufactured by Tokyo Chemical Industry Co., Ltd., purity: 98% or more)

[Example 1] Production of Curable Composition (D1)

First, reagents listed below were mixed.
Polymerization initiator (A1): 3 parts
Polymerizable compound (B1): 9 parts
Polymerizable compound (B2): 38 parts
Polymerizable compound (B3): 47 parts
Internal addition type release agent (C1): 0.5 part Next, the resultant mixed solution was filtered with a filter made of ultrahigh molecular weight polyethylene having a mesh of 5 nm to provide a curable composition (D1).

The physical properties of the resultant curable composition were measured and evaluated by methods to be described below.

(1) Surface Tension
The surface tension of the curable composition at 25° C. was measured by a plate method involving using a platinum plate. It should be noted that the measurement was performed with an automatic surface tension meter DY-300 (manufactured by Kyowa Interface Science Co., Ltd.) under the conditions of a number of times of measurement of 5 and a pre-wet immersion distance of the platinum plate of 0.35 mm. Here, the first measured value was excluded and the average of the second to fifth measured values was defined as the surface tension.

(2) Viscosity
The viscosity of the curable composition at 25° C. was measured with a cone-flat plate type rotary viscometer RE-85L (manufactured by Toki Sangyo Co., Ltd.).

(3) Contact Angle
A contact angle between the curable composition and a substrate was measured with an automatic static contact angle-measuring apparatus Dropmaster 300 (manufactured by Kyowa Interface Science Co., Ltd.). The contact angle is a value 10 seconds after the dropping of the curable composition onto the substrate.

The substrate to be used in the measurement is as described below. It should be noted that in the following description, the mold contact angle is a contact angle between a mold and a curable composition, and the substrate contact angle is a contact angle between a substrate to which a curable composition is applied and the curable composition.

(3-1) Substrate for Measuring Mold Contact Angle

A quartz substrate was used. It should be noted that the surface of the substrate is subjected to UV/ozone cleaning with a UV irradiation apparatus (UVE-110-1H) for 30 minutes.

(3-2) Substrate for Measuring Substrate Contact Angle

A silicon wafer having an adhesion promoting layer having a thickness of 60 nm formed on its surface was used.

The curable composition (D1) of this example had a surface tension of 33.16 mN/m, a viscosity of 3.78 mPa·s, a mold contact angle of 6.4°, and a substrate contact angle of 3.8°.

In addition, the value $(\gamma_1-\gamma_2)/\gamma_1$ determined by using the value of the surface tension (33.37 mN/m) of a curable composition (D6) of Comparative Example 2 to be described later was as follows: $(\gamma_1-\gamma_2)/\gamma_1=(33.16-33.37)/33.16=-0.6\%$.

[Example 2] Production of Curable Composition (D2)

A curable composition (D2) was obtained by the same method as that of Example 1 except that in Example 1, 1.6 parts of (C2) was added as an internal addition type release agent instead of the addition of 0.5 part of (C1).

In addition, the physical properties of the curable composition (D2) of this example were measured and evaluated by the same methods as those of Example 1. As a result, the composition had a surface tension of 33.16 mN/m, a viscosity of 4.14 mPa·s, a mold contact angle of 4.6°, and a substrate contact angle of 4.7°.

In addition, the value $(\gamma_1-\gamma_2)/\gamma_1$ determined by using the value of the surface tension (33.37 mN/m) of a curable composition (D6) of Comparative Example 2 to be described later was as follows: $(\gamma_1-\gamma_2)/\gamma_1=(33.16-33.37)/33.16=-0.6\%$.

[Example 3] Production of Curable Composition (D3)

A curable composition (D3) was obtained by the same method as that of Example 1 except that in Example 1, 0.9 part of (C3) was added as an internal addition type release agent instead of the addition of 0.5 part of (C1).

In addition, the physical properties of the curable composition (D3) of this example were measured and evaluated by the same methods as those of Example 1. As a result, the composition had a surface tension of 34.42 mN/m, a viscosity of 3.86 mPa·s, a mold contact angle of 5.9°, and a substrate contact angle of 4.9°.

In addition, the value $(\gamma_1-\gamma_2)/\gamma_1$ determined by using the value of the surface tension (33.37 mN/m) of a curable composition (D6) of Comparative Example 2 to be described later was as follows: $(\gamma_1-\gamma_2)/\gamma_1=(34.42-33.37)/34.42=3.1\%$.

[Example 4] Production of Curable Composition (D4)

A curable composition (D4) was obtained by the same method as that of Example 3 except that in Example 3, 3 parts of the polymerization initiator (A2) was added instead of the addition of 3 parts of the polymerization initiator (A1).

In addition, the physical properties of the curable composition (D4) of this example were measured and evaluated by the same methods as those of Example 1. As a result, the composition had a surface tension of 32.66 mN/m, a viscosity of 4.04 mPa·s, a mold contact angle of 5.1°, and a substrate contact angle of 3.7°.

The value $(\gamma_1-\gamma_2)/\gamma_1$ determined by using the value of the surface tension (32.71 mN/m) of a curable composition (D8) of Comparative Example 4 to be described later was as follows: $(\gamma_1-\gamma_2)/\gamma_1=(32.66-32.71)/32.66=-0.2\%$.

[Comparative Example 1] Production of Curable Composition (D5)

A curable composition (D5) was obtained by the same method as that of Example 1 except that in Example 1, 1.1 parts of (C4) was added as an internal addition type release agent instead of the addition of 0.5 part of (C1).

In addition, the physical properties of the curable composition (D5) of this comparative example were measured and evaluated by the same methods as those of Example 1. As a result, the composition had a surface tension of 27.7 mN/m, a viscosity of 3.86 mPa·s, a mold contact angle of 24.2°, and a substrate contact angle of 10.8°.

In addition, the value $(\gamma_1-\gamma_2)/\gamma_1$ determined by using the value of the surface tension (33.37 mN/m) of a curable composition (D6) of Comparative Example 2 to be described later was as follows: $(\gamma_1-\gamma_2)/\gamma_1=(27.7-33.37)/27.7=-20.5\%$.

[Comparative Example 2] Production of Curable Composition (D6)

The curable composition (D6) was obtained by the same method as that of Example 1 except that in Example 1, no internal addition type release agent was added.

In addition, the physical properties of the curable composition (D6) of this comparative example were measured and evaluated by the same methods as those of Example 1. As a result, the composition had a surface tension of 33.37 mN/m, a viscosity of 3.73 mPa·s, a mold contact angle of 3.7°, and a substrate contact angle of 3.5°. It should be noted that the curable composition (D6) of this comparative example is a curable composition (curable composition for evaluation) having the same composition as that of each of the curable compositions ((D1) to (D3)) produced in Examples 1 to 3 except that the curable composition is free of any internal addition type release agent.

[Comparative Example 3] Production of Curable Composition (D7)

A curable composition (D7) was obtained by the same method as that of Example 4 except that in Example 4, 1.1 parts of (C4) was added as an internal addition type release agent instead of the addition of 0.9 part of (C3).

In addition, the physical properties of the curable composition (D7) of this comparative example were measured and evaluated by the same methods as those of Example 1. As a result, the composition had a surface tension of 29.08 mN/m, a viscosity of 4.02 mPa·s, a mold contact angle of 22.9°, and a substrate contact angle of 6.1°.

In addition, the value $(\gamma_1-\gamma_2)/\gamma_1$ determined by using the value of the surface tension (32.71 mN/m) of a curable composition (D8) of Comparative Example 4 to be described later was as follows: $(\gamma_1-\gamma_2)/\gamma_1=(29.08-32.71)/29.08=-12.5\%$.

[Comparative Example 4] Production of Curable Composition (D8)

The curable composition (D8) was obtained by the same method as that of Example 4 except that in Example 4, no internal addition type release agent was added.

In addition, the physical properties of the curable composition (D8) of this comparative example were measured and evaluated by the same methods as those of Example 1. As a result, the composition had a surface tension of 32.71 mN/m, a viscosity of 3.86 mPa·s, a mold contact angle of 3.3°, and a substrate contact angle of 3.6°. It should be noted that the curable composition (D8) of this comparative example is a curable composition (curable composition for evaluation) having the same composition as that of the curable composition (D4) produced in Example 4 except that the curable composition is free of any internal addition type release agent.

[Example 5] Production of Curable Composition (D9)

A curable composition (D9) was obtained by the same method as that of Example 2 except that in Example 2, 3 parts of the polymerization initiator (A3) and 0.5 part of the sensitizer (E1) were added instead of the addition of 3 parts of the polymerization initiator (A1).

In addition, the physical properties of the curable composition (D9) of this example were measured and evaluated by the same methods as those of Example 1. As a result, the composition had a surface tension of 33.27 mN/m, a viscosity of 4.31 mPa·s, a mold contact angle of 3.3°, and a substrate contact angle of 3.5°.

Further, the value $(\gamma_1-\gamma_2)/\gamma_1$ determined by using the value of the surface tension (32.66 mN/m) of a curable composition (D10) of Comparative Example 2 to be described later was as follows: $(\gamma_1-\gamma_2)/\gamma_1=(33.27-32.66)/33.27=1.8\%$.

[Comparative Example 5] Production of Curable Composition (D10)

The curable composition (D10) was obtained by the same method as that of Example 5 except that in Example 5, no internal addition type release agent was added.

In addition, the physical properties of the curable composition (D10) of this comparative example were measured and evaluated by the same methods as those of Example 1. As a result, the composition had a surface tension of 32.66 mN/m, a viscosity of 3.90 mPa·s, a mold contact angle of 3.3°, and a substrate contact angle of 3.5°. It should be noted that the curable composition (D10) of this comparative example is a curable composition (curable composition for evaluation) having the same composition as that of the curable composition (D9) produced in Example 5 except that the curable composition is free of any internal addition type release agent.

Table 1 below shows the composition of the curable composition produced in any one of Examples 1 to 5 and Comparative Examples 1 to 5 described above.

TABLE 1

| | Polymerization initiator [part(s) by weight] | | | Polymerizable compound [part(s) by weight] | | | Internal addition type release agent [part(s) by weight] | | | |
|---|---|---|---|---|---|---|---|---|---|---|
| | A1 | A2 | A3 | B1 | B2 | B3 | C1 | C2 | C3 | C4 |
| Example 1 | 3 | — | — | 9 | 38 | 47 | 0.5 | — | — | — |
| Example 2 | 3 | — | — | 9 | 38 | 47 | — | 1.6 | — | — |
| Example 3 | 3 | — | — | 9 | 38 | 47 | — | — | 0.9 | — |
| Comparative Example 1 | 3 | — | — | 9 | 38 | 47 | — | — | — | 1.1 |
| Comparative Example 2 | 3 | — | — | 9 | 38 | 47 | — | — | — | — |
| Example 4 | — | 3 | — | 9 | 38 | 47 | — | — | 0.9 | — |
| Comparative Example 3 | — | 3 | — | 9 | 38 | 47 | — | — | — | 1.1 |
| Comparative Example 4 | — | 3 | — | 9 | 38 | 47 | — | — | — | — |
| Example 5(Note 1) | — | — | 3 | 9 | 38 | 47 | — | 1.6 | — | — |
| Comparative Example 5(Note 1) | — | — | 3 | 9 | 38 | 47 | — | — | — | — |

(Note 1) 0.5 Part of the sensitizer (E1) is further added.

[Example 6] Production of Film (Cured Film)

A film (cured film) was produced by using the curable composition (D1) produced in Example 1 by the method illustrated in FIGS. 1A to 1F. In addition, in this example (Example 6), all of the placing step, the mold contact step, the curing step, and the releasing step were performed under a helium atmosphere.

(1) Placing Step (FIG. 1A)

A total of 1,440 droplets of the curable composition 1 (11 pL per droplet) were dropped onto a silicon wafer (the substrate 2) by an inkjet method (FIG. 1A). It should be noted that the substrate 2 has a thickness of 300 mm and has an adhesion promoting layer having a thickness of 3 nm (not shown) formed on its surface. In addition, the respective droplets were dropped so that the respective droplets were placed at substantially equal intervals in a region measuring 26 mm wide by 33 mm long.

(2) Mold Contact Step (FIGS. 1B1 and 1B2)

Next, a quartz mold 3 (measuring 26 mm wide by 33 mm long) which had a 28-nm line-and-space (L/S) pattern formed thereon and whose surface had not been subjected to any internal addition type release agent treatment was brought into contact with the curable composition 1 provided on the substrate 2 (FIGS. 1B1 and 1B2).

(3) Curing Step (FIG. 1C)

Next, 30 seconds after the quartz mold 3 had been brought into contact with the curable composition 1, the curable composition 1 was irradiated with UV light 4 by using a UV light source provided with a 200-W mercury-xenon lamp through the quartz mold 3 to produce the cured film 12 (FIG. 1C). It should be noted that EXECURE 3000 (manufactured by HOYA CANDEO OPTRONICS CORPORATION) was used as the light source for the UV light 4 (UV light source). In addition, upon irradiation with the UV light 4, an interference filter capable of selectively transmitting light having a wavelength of 313±5 nm (VPF-50C-10-25-31300 manufactured by SIGMA KOKI CO., LTD.) was placed between the UV light source and the quartz mold 3. In addition, the illuminance of the UV light 4 directly below the quartz mold 3 was 40 mW/cm$^2$ at a wavelength of 313 nm. The irradiation with the UV light was performed under the above-mentioned conditions for 0.75 second (exposure: 30 mJ/cm$^2$).

(4) Releasing Step (FIG. 1D)

Next, the quartz mold 3 was released from the cured film 12 by lifting the quartz mold 3 under the condition of 0.5 mm/s. Thus, the cured film 12 having a predetermined pattern shape was produced on the substrate 2. It should be noted that the force needed for releasing the mold from the cured film 12 was 74 N.

[Example 7]

A cured film was produced by the same method as that of Example 6 except that in Example 6, the curable composition (D2) was used instead of the curable composition (D1). It should be noted that in this example, the force needed for releasing the quartz mold 3 from the cured film 12 in the releasing step was 79 N.

[Example 8]

A cured film was produced by the same method as that of Example 6 except that in Example 6, the curable composition (D3) was used instead of the curable composition (D1). It should be noted that in this example, the force needed for releasing the quartz mold 3 from the cured film 12 in the releasing step was 84 N.

[Example 9]

A cured film was produced by the same method as that of Example 6 except that in Example 6, the curable composition (D4) was used instead of the curable composition (D1). It should be noted that in this example, the force needed for releasing the quartz mold 3 from the cured film 12 in the releasing step was 79 N.

[Comparative Example 6]

A cured film was produced by the same method as that of Example 6 except that in Example 6, the curable composition (D5) was used instead of the curable composition (D1). It should be noted that in this comparative example, the force needed for releasing the quartz mold 3 from the cured film 12 in the releasing step was 63 N.

[Comparative Example 7]

A cured film was produced by the same method as that of Example 6 except that in Example 6, the curable composition (D6) was used instead of the curable composition (D1). It should be noted that in this comparative example, the force needed for releasing the quartz mold 3 from the cured film 12 in the releasing step was 95 N.

[Comparative Example 8]

A cured film was produced by the same method as that of Example 6 except that in Example 6, the curable composition (D7) was used instead of the curable composition (D1). It should be noted that in this comparative example, the force needed for releasing the quartz mold 3 from the cured film 12 in the releasing step was 74 N.

[Comparative Example 9]

A cured film was produced by the same method as that of Example 6 except that in Example 6, the curable composition (D8) was used instead of the curable composition (D1). It should be noted that in this comparative example, the force needed for releasing the quartz mold 3 from the cured film 12 in the releasing step was 95 N.

[Example 10]

A cured film was produced by the same method as that of Example 6 except that in Example 6, the curable composition (D9) was used instead of the curable composition (D1). It should be noted that in this example, the force needed for releasing the quartz mold 3 from the cured film 12 in the releasing step was 69 N.

[Comparative Example 10]

A cured film was produced by the same method as that of Example 6 except that in Example 6, the curable composition (D10) was used instead of the curable composition (D1). It should be noted that in this comparative example, the force needed for releasing the quartz mold 3 from the cured film 12 in the releasing step is not measured, but can be estimated to be about 95 N from the results of Comparative Example 7 and Comparative Example 9 each using a cured film free of any internal addition type release agent.

Table 2 below shows the results.

TABLE 2

|  | $\gamma_1$ | $\gamma_2$ | $\gamma$ (Note 1) [%] | $\gamma_1 \cos\theta$ | Mold contact angle [°] | Substrate contact angle [°] | Viscosity [mPa·s] | Releasing force [N] |
|---|---|---|---|---|---|---|---|---|
| Example 6 | 33.16 | 33.37 | −0.6 | 32.95 | 6.4 | 3.8 | 3.78 | 74 |
| Example 7 | 33.16 | 33.37 | −0.6 | 33.05 | 4.6 | 4.7 | 4.14 | 79 |
| Example 8 | 34.42 | 33.37 | 3.1 | 34.24 | 5.9 | 4.9 | 3.86 | 84 |
| Comparative Example 6 | 27.7 | 33.37 | −20.5 | 25.27 | 24.2 | 10.8 | 3.86 | 63 |
| Comparative Example 7 | — | 33.37 | — | 33.30 | 3.7 | 3.5 | 3.73 | 95 |
| Example 9 | 32.66 | 32.71 | −0.2 | 32.53 | 5.1 | 3.7 | 4.04 | 79 |
| Comparative Example 8 | 29.08 | 32.71 | −12.5 | 26.79 | 22.9 | 6.1 | 4.02 | 74 |
| Comparative Example 9 | — | 32.71 | — | 32.66 | 3.3 | 3.6 | 3.86 | 95 |
| Example 10 | 33.27 | 32.66 | 1.8 | 33.21 | 3.3 | 3.5 | 4.31 | 69 |
| Comparative Example 10 | — | 32.66 | — | 32.61 | 3.3 | 3.5 | 3.90 | — |

(Note 1) $\gamma = (\gamma_1 - \gamma_2)/\gamma_1$

As can be understood from Table 2, the curable composition of the present invention is excellent in filling property and exhibits a releasing force reducing effect based on its internal addition type release agent.

As can be understood from, for example, Examples 6 to 10, the ratio $(\gamma_1-\gamma_2)/\gamma_2$ of each of the curable compositions produced in Examples 1 to 5 (D1 to D4 and D9) falls within the range of from −5% or more to 5% or less, and hence the internal addition type release agent is not unevenly distributed in the gas-liquid interface. It is also understood that each of the curable compositions has a fast filling speed because its $\gamma_1 \cos\theta$ is 30 or more, which is comparable to those of the curable compositions of Comparative Examples 7 and 9 free of any internal addition type release agent (D6, D8, and D10). Further, it has been demonstrated that when films are produced in Examples 6 to 10 by using the curable compositions produced in Examples 1 to 5, releasing forces applied to the films are considerably small as compared to releasing forces applied to films produced by using the curable compositions free of any internal addition type release agent (Comparative Examples 7 and 9), and hence the films are excellent in releasability.

Meanwhile, as can be understood from Comparative Example 6, when a film is produced by using the curable composition (D5) of Comparative Example 1 containing a fluorine-based surfactant, the releasing force applied to the film is as small as 63 N, but the ratio $(\gamma_1-\gamma_2)/\gamma_1$ is negatively as large as −20.5% and hence the internal addition type release agent is unevenly distributed in the gas-liquid interface. It is also understood that the curable composition has a slow filling speed because its $\gamma_1 \cos\theta$ is as small as 25.27. It is similarly understood that Comparative Example 8 in which a film is produced by using the curable composition (D7) of Comparative Example 3 containing a fluorine-based surfactant has a releasing force as small as 74 N, but the ratio $(\gamma_1-\gamma_2)/\gamma_2$ is negatively as large as −12.5% and hence the internal addition type release agent is unevenly distributed in the gas-liquid interface. It is also understood that the curable composition has a slow filling speed because its $\gamma_1 \cos\theta$ is as small as 26.79.

Therefore, it has been demonstrated that the curable composition of the present invention using the internal addition type release agent that is not unevenly distributed in its gas-liquid interface has a fast filling speed into a filling mold and enables the production of a film excellent in releasability.

[Example 11]

In Example 6, the curable composition (D9) was used instead of the curable composition (D1). In addition, in Example 6, a mixed gas obtained by mixing helium and 1,1,1,3,3-pentafluoropropane as a condensable gas at a flow rate ratio of 1:4 was used instead of helium as the atmosphere of the mold contact step. Further, the irradiation time of the UV light in the curing step was changed from 0.75 second to 5 seconds. A cured film was produced by the same method as that of Example 6 except the foregoing. It should be noted that in this example, the curable composition (D9) was observed to be quickly filled in the filling step as compared to Example 10 in which the curable composition (D9) was filled under a helium atmosphere. In addition, the force needed for releasing the quartz mold 3 from the cured film 12 in the releasing step was 59 N.

The results of Example 11 demonstrated that when the mold contact step was performed in an atmosphere containing a condensable gas, the filling property improved and the releasing force reduced. That is, in Example 11, a releasing force reducing effect of 10 N was observed with respect to Example 10 having a releasing force of 69 N.

According to an embodiment of the present invention, the curable composition that has a fast filling speed into a mold and provides a film excellent in releasability can be provided.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-179570, filed Aug. 30, 2013, Japanese Patent Application No. 2013-247605, filed Nov. 29, 2013, and Japanese Patent Application No. 2014-162297, filed Aug. 8, 2014 which are hereby incorporated by reference herein in its their entirety.

The invention claimed is:

1. A curable composition, which is suitable for use in imprinting, the curable composition comprising:
   a polymerization initiator;
   a radically polymerizable compound; and
   an internal addition type release agent having a hydrophilic functional group,
   wherein the internal addition type release agent is prevented from being unevenly distributed in a gas-liquid interface of the curable composition, and
   wherein the internal addition type release agent is a compound represented by formula (A):

$$R\text{—}(OR')_n\text{—}X \qquad (A),$$

wherein, in the formula (A), R represents an alkyl group having 10 to 20 carbon atoms, OR' represents an oxyethylene group, X represents a hydroxyl group, and n represents an integer of 3 to 30.

2. A curable composition, which is suitable for use in imprinting, the curable composition comprising:
   a polymerization initiator;
   a radically polymerizable compound; and
   an internal addition type release agent having a hydrophilic functional group,
   wherein the internal addition type release agent is a compound represented by formula (A):

$$R\text{—}(OR')_n\text{—}X \qquad (A),$$

wherein, in the formula (A), R represents an alkyl group having 10 to 20 carbon atoms, OR' represents an oxyethylene group, X represents a hydroxyl group, and n represents an integer of 3 to 30, and
   wherein the curable composition satisfies formula (1):

$$-5\% \leq \{(\gamma_1-\gamma_2)/\gamma_1\} \leq 5\% \qquad (1),$$

wherein, in the formula (1), $\gamma_1$ represents a surface tension of the curable composition at 25° C., and $\gamma_2$ represents a surface tension of a curable composition for evaluation at 25° C., the curable composition for evaluation having the same composition as that of the curable composition except that the curable composition for evaluation is free of the internal addition type release agent.

3. The curable composition according to claim 1, wherein the curable composition satisfies formula (1):

$$-5\% \leq \{(\gamma_1-\gamma_2)/\gamma_1\} \leq 5\% \qquad (1),$$

wherein, in the formula (1), $\gamma_1$ represents a surface tension of the curable composition at 25° C., and $\gamma_2$ represents a surface tension of a curable composition for evaluation at 25° C., the curable composition for evaluation having the same composition as that of the curable composition except that the curable composition for evaluation is free of the internal addition type release agent.

4. The curable composition according to claim 1, wherein the curable composition satisfies formula (2):

$$\gamma_1 \cos\theta \geq 30 \text{ mJ/m}^2 \qquad (2),$$

wherein, in the formula (2), $\gamma_1$ represents a surface tension of the curable composition at 25° C., and $\theta$ represents a contact angle between a mold and the curable composition.

5. The curable composition according to claim 1, wherein the polymerization initiator comprises a photopolymerization initiator.

6. A method of producing a film having a predetermined pattern shape and placed on a substrate, the method comprising:
 a placing step of placing a curable composition on the substrate;
 a mold contact step of bringing a mold having a hydrophilic surface and the curable composition into contact with each other;
 a curing step of curing the curable composition with one of light and heat to produce a cured film; and
 a releasing step of releasing the mold from the cured film,
 wherein the curable composition comprises a polymerization initiator, a polymerizable compound, and an internal addition type release agent having a hydrophilic functional group,
 wherein the internal addition type release agent is a compound represented by formula (A):

R—(OR')$_n$—X  (A), wherein, in the formula (A), R represents an alkyl group having 10 to 20 carbon atoms, OR' represents an oxyethylene group, X represents a hydroxyl group, and n represents an integer of 3 to 30, and
 wherein the internal addition type release agent is prevented from being unevenly distributed in a gas-liquid interface of the curable composition in the placing step.

7. The method according to claim 6, wherein the curable composition satisfies formula (1):

$$-5\% \leq \{(\gamma_1-\gamma_2)/\gamma_1\} \leq 5\% \qquad (1),$$

wherein, in the formula (1), $\gamma_1$ represents a surface tension of the curable composition at 25° C., and $\gamma_2$ represents a surface tension of a curable composition for evaluation at 25° C., the curable composition for evaluation having the same composition as that of the curable composition except that the curable composition for evaluation is free of the internal addition type release agent.

8. The method according to claim 6, wherein the curable composition satisfies formula (2):

$$\gamma_1 \cos\theta \geq 30 \text{ mJ/m}^2 \qquad (2),$$

wherein, in the formula (2), $\gamma_1$ represents a surface tension of the curable composition at 25° C., and $\theta$ represents a contact angle between the mold and the curable composition.

9. The method according to claim 6, wherein the internal addition type release agent adsorbs to an interface at which the curable composition or the cured film comes into contact with the mold during a time period from the contact of the mold with the curable composition to the release of the mold from the cured film.

10. The method according to claim 6, wherein the mold contact step is performed in an atmosphere containing a condensable gas.

11. The method according to claim 10, wherein the condensable gas comprises 1,1,1,3,3-pentafluoropropane.

12. The method according to claim 10, wherein the atmosphere containing the condensable gas comprises a mixed gas of helium and the condensable gas.

13. A method of producing a substrate with a circuit, the method comprising performing one of etching and ion implantation based on a pattern shape of a film obtained by a method of producing a film having a predetermined pattern shape and placed on a substrate to form a circuit structure on the substrate based on the pattern shape,
 the method of producing the film comprising:
 a placing step of placing a curable composition on the substrate;
 a mold contact step of bringing a mold having a hydrophilic surface and the curable composition into contact with each other;
 a curing step of curing the curable composition with one of light and heat to produce a cured film; and
 a releasing step of releasing the mold from the cured film,
 wherein the curable composition comprises a polymerization initiator, a polymerizable compound, and an internal addition type release agent having a hydrophilic functional group,
 wherein the internal addition type release agent is a compound represented by formula (A):

R—(OR')$_n$—X  (A), wherein, in the formula (A), R represents an alkyl group having 10 to 20 carbon atoms, OR' represents an oxyethylene group, X represents a hydroxyl group, and n represents an integer of 3 to 30, and
 wherein the internal addition type release agent is prevented from being unevenly distributed in a gas-liquid interface of the curable composition in the placing step.

14. An optical member, comprising:
 a substrate; and
 a film placed on the substrate,
 wherein the film is a cured film produced by a method of producing a film having a predetermined pattern shape, the method comprising:
 a placing step of placing a curable composition on the substrate;
 a mold contact step of bringing a mold having a hydrophilic surface and the curable composition into contact with each other;
 a curing step of curing the curable composition with one of light and heat to produce a cured film; and
 a releasing step of releasing the mold from the cured film,
 wherein the curable composition comprises a polymerization initiator, a polymerizable compound, and an internal addition type release agent having a hydrophilic functional group,
 wherein the internal addition type release agent is a compound represented by formula (A):

R—(OR')$_n$—X  (A), wherein, in the formula (A), R represents an alkyl group having 10 to 20 carbon atoms, OR' represents an oxyethylene group, X represents a hydroxyl group, and n represents an integer of 3 to 30, and wherein the internal addition type release agent is prevented from being unevenly distributed in a gas-liquid interface of the curable composition in the placing step.

15. The curable composition according to claim 1, wherein the radically polymerizable compound comprises a monofunctional (meth)acrylic compound and a polyfunctional (meth)acrylic compound.

* * * * *